(12) United States Patent
Nakanishi

(10) Patent No.: US 11,711,070 B2
(45) Date of Patent: Jul. 25, 2023

(54) SEMICONDUCTOR DEVICE

(71) Applicant: Nuvoton Technology Corporation Japan, Kyoto (JP)

(72) Inventor: Kazuyuki Nakanishi, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 0 days.

(21) Appl. No.: 17/698,870

(22) Filed: Mar. 18, 2022

(65) Prior Publication Data
US 2022/0209752 A1 Jun. 30, 2022

Related U.S. Application Data

(63) Continuation of application No. PCT/JP2020/019309, filed on May 14, 2020.

(30) Foreign Application Priority Data

Sep. 27, 2019 (JP) ................................ 2019-177826

(51) Int. Cl.
H03K 3/037 (2006.01)
H03K 3/3562 (2006.01)
(Continued)

(52) U.S. Cl.
CPC ....... *H03K 3/0375* (2013.01); *H01L 21/8238* (2013.01); *H01L 27/092* (2013.01);
(Continued)

(58) Field of Classification Search
CPC .... H03K 3/013; H03K 3/0372; H03K 3/0375; H03K 3/356104; H03K 3/35625; H03K 19/00338; H01L 21/8238; H01L 27/092
See application file for complete search history.

(56) References Cited

U.S. PATENT DOCUMENTS 9,344,067 B1 * 5/2016 Wu ........................ H10B 10/12
9,768,757 B1 9/2017 Gaspard et al.
(Continued)

FOREIGN PATENT DOCUMENTS

JP 2010-092963 A 4/2010
JP 2010-212786 A 9/2010
(Continued)

OTHER PUBLICATIONS

International Search Report dated Aug. 4, 2020 in International Patent Application No. PCT/JP2020/019309, with English translation.
(Continued)

*Primary Examiner* — Patrick O Neill
(74) *Attorney, Agent, or Firm* — McDermott Will & Emery LLP

(57) ABSTRACT

A semiconductor device includes: a first latch circuit that includes a first inverting circuit, a second inverting circuit, a third inverting circuit, and a fourth inverting circuit; a first first-type well region; a second first-type well region; and a second-type well region. In a plan view, a distance between a drain of a first-type MOS transistor in the first inverting circuit and a drain of a first-type MOS transistor in the third inverting circuit is longer than a distance between the drain of the first-type MOS transistor in the first inverting circuit and a drain of a first-type MOS transistor in the fourth inverting circuit.

7 Claims, 22 Drawing Sheets

(51) Int. Cl.
*H03K 3/356* (2006.01)
*H01L 21/8238* (2006.01)
*H01L 27/092* (2006.01)

(52) U.S. Cl.
CPC ....... *H03K 3/0372* (2013.01); *H03K 3/35625* (2013.01); *H03K 3/356104* (2013.01)

(56) References Cited

U.S. PATENT DOCUMENTS

| | | |
|---|---|---|
| 2009/0184733 A1 | 7/2009 | Lilja |
| 2010/0084689 A1 | 4/2010 | Nakamura |
| 2010/0225356 A1 | 9/2010 | Uemura et al. |
| 2021/0194470 A1 | 6/2021 | Maru et al. |

FOREIGN PATENT DOCUMENTS

| | | |
|---|---|---|
| JP | 2011-512026 A | 4/2011 |
| JP | 2013-143666 A | 7/2013 |
| JP | 5369771 B2 | 12/2013 |
| WO | 2009/091928 A2 | 7/2009 |
| WO | 2018/230235 A1 | 12/2018 |

OTHER PUBLICATIONS

K. Kobayashi et al., "A Low-Power and Area-Efficient Radiation-Hard Redundant Flip-Flop, DICE ACFF, in a 65 nm Thin-BOX FD-SOI," IEEE Transactions on Nuclear Science, vol. 61, No. 4, Aug. 2014, pp. 1881-1888.

\* cited by examiner

SEMICONDUCTOR DEVICE

CROSS REFERENCE TO RELATED APPLICATIONS

This is a continuation application of PCT International Application No. PCT/JP2020/019309 filed on May 14, 2020, designating the United States of America, which is based on and claims priority of Japanese Patent Application No. 2019-177826 filed on Sep. 27, 2019. The entire disclosures of the above-identified applications, including the specifications, drawings and claims are incorporated herein by reference in their entirety.

FIELD

The present disclosure relates to a semiconductor device that includes a latch circuit and a flip-flop circuit.

BACKGROUND

In semiconductor devices, soft errors in latch circuits (also referred to as flip-flop circuits) in logic circuits have been problems. A soft error refers to a temporary error of inverting the state of a latch circuit by noise entering the latch circuit due to collision of particle rays such as cosmic rays against the latch circuit.

As an example of a circuit having high soft error resistance, the latch circuit illustrated in FIG. 2 of Patent Literature (PTL) 1 includes four inverter circuits, and the same data is input to the gates of a PMOS transistor and an NMOS transistor of each inverter circuit, but the gates are connected to different nodes. Even if noise that may cause a soft error enters one of the four nodes, the state of the latch circuit can be restored based on the other nodes. However, if out of the four nodes, two nodes that have the same data are influenced by a soft error, the state of the latch circuit is likely to be inverted, which is a drawback. According to PTL 1, the PMOS and NMOS transistors are alternately disposed in order to cancel noise, so that the above drawback is overcome.

On the other hand, a flip-flop circuit is one of the most important basic circuits that greatly affect the area of a chip, and thus there is a demand for decreasing an area of the flip-flop circuit. Nevertheless, according to the disposition illustrated in FIG. 12 of PTL 1, an N well where PMOS transistors are disposed and a P well where NMOS transistors are disposed each need to be separated into at least two, which deteriorates the disposition efficiency so that the area of the flip-flop circuit cannot be decreased.

For example, according to the disposition illustrated in FIG. 7 of Non Patent Literature (NPL) 1, all the PMOS transistors can be efficiently disposed in a single N well, and thus is suitable for decreasing an area.

CITATION LIST

Patent Literature

PTL 1: Japanese Patent No. 5369771

Non Patent Literature

NPL 1: "A Low-Power and Area-Efficient Radiation-Hard Redundant Flip-Flop, DICE ACFF, in a 65 nm Thin-BOX FD-SOI", IEEE TRANSACTIONS ON NUCLEAR SCIENCE, VOL. 61, NO. 4, Aug. 2014

SUMMARY

Technical Problem

If the PMOS transistors of the above conventional latch circuit are disposed in a single N well to reduce the areas of the PMOS transistors, two nodes having the same data out of the four nodes in the latch circuit are disposed close to each other and thus are readily and simultaneously exposed to noise, and soft error resistance is low, which is a problem.

The present disclosure provides a semiconductor device that includes a latch circuit having high soft error resistance and a small area.

Solution to Problem

A semiconductor device according to an aspect of the present disclosure includes: a first latch circuit that includes a first inverting circuit, a second inverting circuit, a third inverting circuit, and a fourth inverting circuit; a first first-type well region; a second first-type well region; and a second-type well region. The first inverting circuit, the second inverting circuit, the third inverting circuit, and the fourth inverting circuit each include: a first-type MOS transistor; a second-type MOS transistor; and an output node connected to a drain of the first-type MOS transistor and a drain of the second-type MOS transistor. The output node of the first inverting circuit is connected to a gate of the first-type MOS transistor in the second inverting circuit and a gate of the second-type MOS transistor in the fourth inverting circuit. The output node of the second inverting circuit is connected to a gate of the first-type MOS transistor in the third inverting circuit and a gate of the second-type MOS transistor in the first inverting circuit. The output node of the third inverting circuit is connected to a gate of the first-type MOS transistor in the fourth inverting circuit and a gate of the second-type MOS transistor in the second inverting circuit. The output node of the fourth inverting circuit is connected to a gate of the first-type MOS transistor in the first inverting circuit and a gate of the second-type MOS transistor in the third inverting circuit. The drain of the first-type MOS transistor in the first inverting circuit, the drain of the first-type MOS transistor in the second inverting circuit, the drain of the first-type MOS transistor in the third inverting circuit, and the drain of the first-type MOS transistor in the fourth inverting circuit are disposed in the second-type well region. The drain of the second-type MOS transistor in the first inverting circuit and the drain of the second-type MOS transistor in the second inverting circuit are disposed in the first first-type well region. The drain of the second-type MOS transistor in the third inverting circuit and the drain of the second-type MOS transistor in the fourth inverting circuit are disposed in the second first-type well region. The second-type well region is located between the first first-type well region and the second first-type well region. In a plan view, a distance between the drain of the first-type MOS transistor in the first inverting circuit and the drain of the first-type MOS transistor in the third inverting circuit is longer than a distance between the drain of the first-type MOS transistor in the first inverting circuit and the drain of the first-type MOS transistor in the fourth inverting circuit.

Advantageous Effects

According to the present disclosure, a latch circuit of a semiconductor device having high soft error resistance and a small area can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

The following describes in detail embodiments with reference to the drawings. Note that the embodiments described below each show a preferable specific example of the present disclosure. The numerical values, shapes, materials, elements, the arrangement and connection of the elements, steps, and the order of processing the steps, for instance, described in the following embodiments are examples, and thus are not Intended to limit the present disclosure. Among the elements in the following embodiments, elements not recited in the independent claim defining an embodiment according to an aspect of the present disclosure are described as optional elements. The embodiments of the present disclosure are not limited to the current independent claim, but may be expressed by another independent claim. The drawings are schematic drawings, and thus do not necessarily illustrate strict dimensions.

Embodiment 1

A semiconductor device according to the present embodiment includes a latch circuit having a redundant configuration in which four inverting circuits are included, and in the latch circuit, drain nodes are disposed such that a distance between two drain nodes having different data is shorter than a distance between two drain nodes having the same data. This disposition increases soft error resistance since even if noise due to alpha rays and neutron rays simultaneously enters the two drain nodes having the same data, the noise is highly likely to also enter the drain nodes having different data, so that the effect of cancelling noise is enhanced. Furthermore, a semiconductor device that includes a latch circuit or a flip-flop circuit having a small area can be provided.

Figure 1:
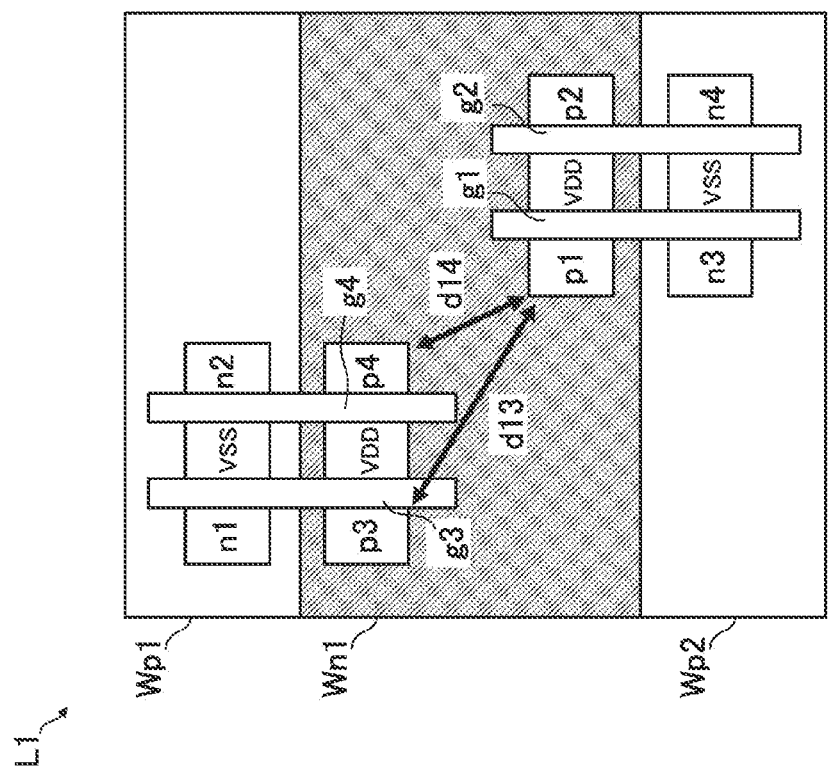
FIG. 1 illustrates an example of planar disposition of a semiconductor device according to Embodiment 1.
Figure 2:
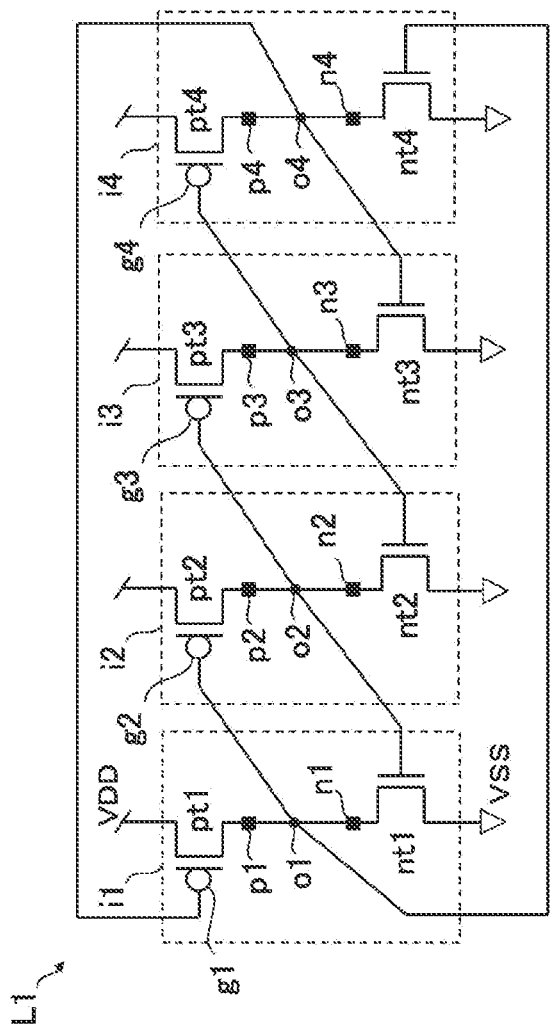
FIG. 2 illustrates an example of a circuit of the semiconductor device according to Embodiment 1.

FIG. 1 illustrates an example of planar disposition of a semiconductor device according to Embodiment 1. FIG. 2 illustrates an example of a circuit of the semiconductor device according to Embodiment 1.

The semiconductor device includes first latch circuit L1 that includes first inverting circuit i1 to fourth inverting circuit i4, as illustrated in FIG. 2. The semiconductor device includes first first-type well region Wp1, second first-type well region Wp2, and second-type well region Wn1. First first-type well region Wp1, second first-type well region Wp2, and second-type well region Wn1 are for forming latch circuit L1.

First inverting circuit i1 includes first-type MOS transistor pt1, second-type MOS transistor nt1, and output node o1 connected to drain p1 of first-type MOS transistor pt1 and the drain of second-type MOS transistor nt1.

Second inverting circuit i2 includes first-type MOS transistor pt2, second-type MOS transistor nt2, and output node o2 connected to drain p2 of first-type MOS transistor pt2 and the drain of second-type MOS transistor nt2.

Third inverting circuit i3 includes first-type MOS transistor pt3, second-type MOS transistor nt3, and output node o3 connected to drain p3 of first-type MOS transistor pt3 and the drain of second-type MOS transistor nt3.

Fourth Inverting circuit i4 includes first-type MOS transistor pt4, second-type MOS transistor nt4, and output node o4 connected to drain p4 of first-type MOS transistor pt4 and the drain of second-type MOS transistor nt4.

The sources of the first-type MOS transistors of first inverting circuit i1 to fourth inverting circuit i4 are connected to power lines having potential VDD, and the sources of the second-type MOS transistors thereof are connected to the ground (GND) lines having potential VSS.

Note that the first type means one of the conductivity types, P type and N type. The second type means the other of the conductivity types, P type and N type. In the examples in FIG. 1 and FIG. 2, the first type is P type and the second type is N type. In the following, the first type may be expressed as P, and the second type may be expressed as N. In addition, the first-type MOS transistor may be expressed as a PMOS transistor, and the second-type MOS transistor may be expressed as an NMOS transistor.

As illustrated in FIG. 2, output node o1 of first inverting circuit i1 is connected to gate g2 of first-type MOS transistor pt2 of second inverting circuit i2 and the gate of second-type MOS transistor nt4 of fourth inverting circuit i4.

Output node o2 of second inverting circuit i2 is connected to gate g3 of first-type MOS transistor pt3 of third inverting circuit i3 and the gate of second-type MOS transistor nt1 of first inverting circuit i1.

Output node o3 of third inverting circuit i3 is connected to gate g4 of first-type MOS transistor pt4 of fourth inverting circuit i4 and the gate of second-type MOS transistor nt2 of second inverting circuit i2.

Output node o4 of fourth inverting circuit i4 is connected to gate g1 of first-type MOS transistor pt1 of first inverting circuit i1 and the gate of second-type MOS transistor nt3 of third inverting circuit i3.

As illustrated in FIG. 1, drains p1 to p4 of first-type MOS transistors pt1 to pt4 of first Inverting circuit i1 to fourth Inverting circuit i4 are all disposed in second-type well region Wn1.

Drains n1 and n2 of second-type MOS transistors nt1 and nt2 of first and second inverting circuits i1 and i2 are all disposed in first first-type well region Wp1.

Drains n3 and n4 of second-type MOS transistors nt3 and nt4 of third and fourth inverting circuits i3 and i4 are all disposed in second first-type well region Wp2.

Second-type well region Wn1 is located between first first-type well region Wp1 and second first-type well region Wp2.

In a plan view, distance d14 between drain p1 of first-type MOS transistor pt1 in first inverting circuit i1 and drain p4 of first-type MOS transistor pt4 in fourth inverting circuit i4 is shorter than distance d13 between drain p1 of first-type MOS transistor pt1 in first inverting circuit i1 and drain p3 of first-type MOS transistor pt3 in third inverting circuit i3. Here, the plan view refers to a view of a principal surface of the semiconductor device in the normal direction. For example, FIG. 1 is a plan view of the semiconductor device.

Note that a drain is also expressed as a drain node, and means a drain region in the circuit disposition as illustrated in FIG. 2.

Such a configuration increases the effect of cancelling noise since the distance between drain nodes p1 and p4 that have different data is shorter than the distance between drain nodes p1 and p3 that have the same data.

Next, an effect of increasing soft error resistance is to be described.

Figure 3:
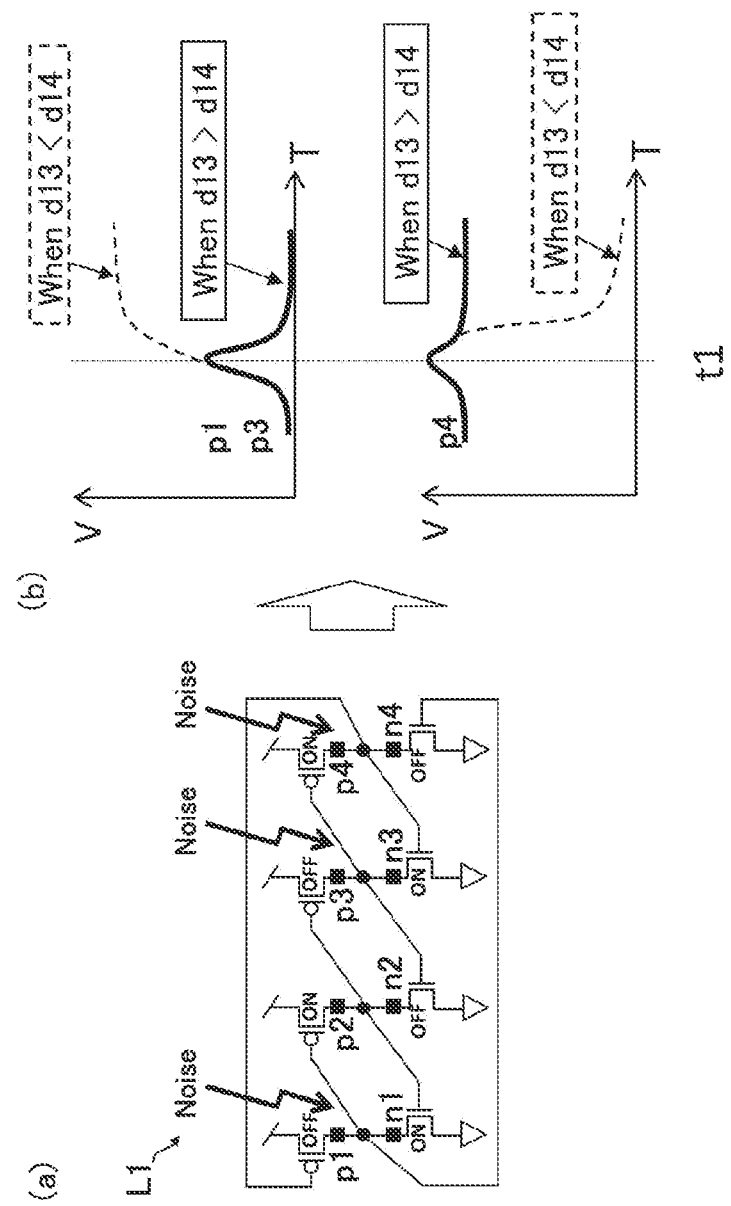
FIG. 3 shows explanatory drawings of operation states of the semiconductor device according to Embodiment 1.

FIG. 3 shows explanatory drawings of operation states of the semiconductor device according to Embodiment 1. Part (a) of FIG. 3 schematically illustrates a state of being exposed to noise in an initial state in which drain nodes p1 and p3 have a low level, whereas drain node p4 has a high level, in the circuit diagram in FIG. 2. Part (b) of FIG. 3 shows explanatory drawings of operation states, illustrating potential states V when drain nodes p1, p3, and p4 in the above initial state are exposed to noise at time ti in time period T. The following describes advantageous effects with reference to FIG. 1, FIG. 2, and FIG. 3.

Normally, a potential at a drain node of a PMOS transistor temporarily increases since electron holes generated due to particle rays gather at the drain node, which is a P-type diffusion region. In the circuit diagram illustrated in FIG. 2, when, for example, drain nodes p1 and p3 are simultaneously influenced by noise, if the distance between drain nodes p1 and p3 is short (when d13<d14), the potential changes to the potential indicated by the broken line illustrated in (b) of FIG. 3 so that the state of the latch circuit is inverted. However, according to the present disclosure, as illustrated in FIG. 1, distance d14 between drain nodes p1 and p4 that have different data is shorter than distance d13 between drain nodes p1 and p3 that have the same data, and thus in FIG. 2, noise readily enters not only drain nodes p1 and p3, but also drain node p4, and the effect of cancelling noise is enhanced. Thus, even if the PMOS transistor that includes drain node p4 is about to transition from the ON state to the OFF state due to noise entering drain node p3, the potential at drain node p4 increases due to noise, and thus the ON state of the NMOS transistor that includes drain node n3 is maintained, and an effect of returning the level of drain nodes p3 and n3 to the low level is exerted. As a result, an effect of preventing inversion of the state of the latch circuit can be produced as shown by the potential state indicated by the solid line in (b) of FIG. 3.

The present embodiment can provide a semiconductor device that includes a latch circuit that is given a small area by disposing drain nodes p1, p2, p3, and p4 in single N well (second-type well region) Wn1, and acquires high soft error resistance by disposing drain nodes p1, p3, and p4 in such a manner that noise is cancelled.

As described above, the semiconductor device according to Embodiment 1 includes: first latch circuit L1 that includes first inverting circuit i1, second inverting circuit i2, third inverting circuit i3, and fourth inverting circuit i4; first first-type well region Wp1; second first-type well region Wp2; and second-type well region Wn1. First inverting circuit i1, second inverting circuit i2, third Inverting circuit i3, and fourth inverting circuit i4 each include: first-type MOS transistor pt1/pt2/pt3/pt4; second-type MOS transistor nt1/nt2/nt3/nt4; and output node o1/o2/o3/o4 connected to a drain of the first-type MOS transistor and a drain of the second-type MOS transistor. Output node o1 of first inverting circuit i1 is connected to gate g2 of first-type MOS transistor pt2 in second inverting circuit i2 and a gate of second-type MOS transistor nt4 in fourth inverting circuit i4. Output node o2 of second inverting circuit i2 is connected to gate g3 of first-type MOS transistor pt3 in third inverting circuit i3 and a gate of second-type MOS transistor nt1 in first inverting circuit i1. Output node o3 of third inverting circuit i3 is connected to gate g4 of first-type MOS transistor pt4 in fourth inverting circuit i4 and a gate of second-type MOS transistor nt2 in second inverting circuit i2. Output node o4 of fourth inverting circuit i4 is connected to gate g1 of first-type MOS transistor pt1 in first inverting circuit 1i and a gate of second-type MOS transistor nt3 in third Inverting circuit i3. Drain p1 of first-type MOS transistor pt1 in first inverting circuit i1, drain p2 of first-type MOS transistor pt2 in second inverting circuit i2, drain p3 of first-type MOS transistor pt3 in third inverting circuit i3, and drain p4 of first-type MOS transistor pt4 in fourth inverting circuit i4 are disposed in second-type well region Wn1.

Drain n1 of second-type MOS transistor nt1 in first inverting circuit i1 and drain n2 of second-type MOS transistor nt2 in second inverting circuit i2 are disposed in first first-type well region Wp1. Drain n3 of second-type MOS transistor nt3 in third Inverting circuit i3 and drain n4 of second-type MOS transistor nt4 in fourth inverting circuit i4 are disposed in second first-type well region Wp2. Second-type well region Wn1 is located between first first-type well region Wp1 and second first-type well region Wp2. In a plan view, distance d14 between drain p1 of first-type MOS transistor pt1 in first inverting circuit i1 and drain p4 of first-type MOS transistor pt4 in fourth inverting circuit i4 is shorter than distance d13 between drain p1 of first-type MOS transistor pt1 in first inverting circuit i1 and drain p3 of first-type MOS transistor pt3 in third inverting circuit i3.

According to this, a latch circuit of a semiconductor device having high soft error resistance and a small area can be provided. The effect of cancelling noise can be enhanced since distance d14 between drain nodes p1 and p4 that have different data is shorter than distance d13 between drain nodes p1 and p3 that have the same data. Further, second-type well region Wn1 is located between two well regions Wp1 and Wp2, and thus the area of the latch circuit can be decreased.

First first-type well region Wp1 and second first-type well region Wp2 may each be a P-type well, and second-type well region Wn1 may be an N-type well.

According to this, soft error resistance can be increased by adopting circuit disposition as illustrated in FIG. 1, for example.

Embodiment 2

Embodiment 2 describes an example of circuit disposition different from that in Embodiment 1.

Figure 4:
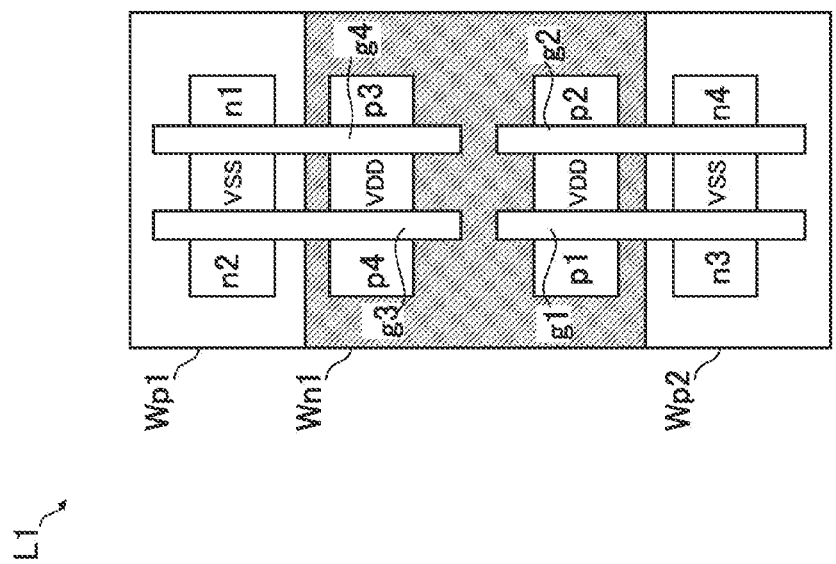
FIG. 4 illustrates an example of planar disposition of a semiconductor device according to Embodiment 2.

FIG. 4 illustrates an example of planar disposition of a semiconductor device according to Embodiment 2. According to the disposition diagram illustrated in FIG. 4, the semiconductor device according to Embodiment 2 is acquired by adopting another disposition of the circuit in Embodiment 1. The description of numerals illustrated in FIG. 4 is the same as that in Embodiment 1, yet the disposition of drain nodes p4, p3, n2, and n1 is different.

In the example of circuit disposition in Embodiment 1 illustrated in FIG. 1, the circuit elements of latch circuit L1 are disposed, being separated into two rectangle regions. In contrast, in the example of circuit disposition in Embodiment 2 illustrated in FIG. 4, circuit elements of latch circuit L1 are efficiently disposed in a single rectangle region.

Similarly to Embodiment 1, the distance (d14) between drain nodes p1 and p4 that have different data is shorter than the distance (d13) between drain nodes p1 and p3 that have the same data. Furthermore, according to the disposition illustrated in FIG. 4, the distance between drain nodes p2 and p3 that have different data is shorter than the distance between drain nodes p2 and p4 that have the same data. Accordingly, the effect of cancelling noise is further enhanced than the effect yielded in Embodiment 1.

As described above, in the semiconductor device according to Embodiment 2, in the plan view, a distance between drain p2 of first-type MOS transistor pt1 in second inverting circuit i2 and drain p4 of first-type MOS transistor pt4 in fourth inverting circuit i4 is longer than a distance between drain p2 of first-type MOS transistor pt2 in second inverting circuit i2 and drain p3 of first-type MOS transistor pt3 in third inverting circuit i3, and is longer than a distance between drain p3 of first-type MOS transistor pt3 in third inverting circuit i3 and drain p4 of first-type MOS transistor pt4 in fourth Inverting circuit i4.

According to this, soft error resistance can be increased and furthermore, the area of the circuit can be decreased, by adopting circuit disposition as illustrated in FIG. 4, for example.

Embodiment 3

Embodiment 3 describes an example in which latch circuit L1 in Embodiments 1 and 2 includes at least one clocked inverting circuit.

Figure 5:
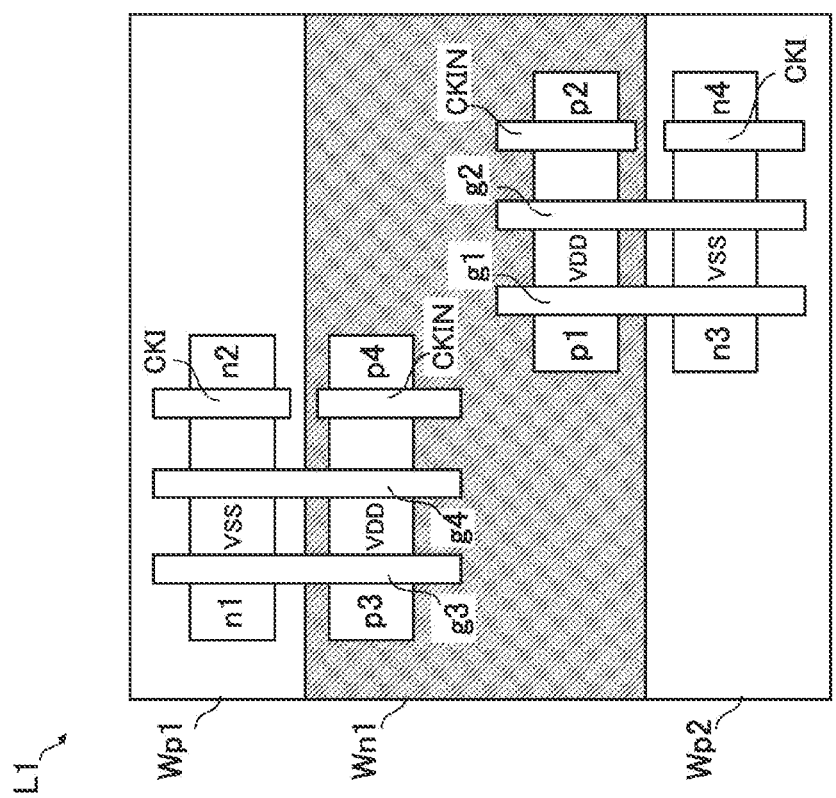
FIG. 5 illustrates an example of planar disposition of a semiconductor device according to Embodiment 3.
Figure 6:
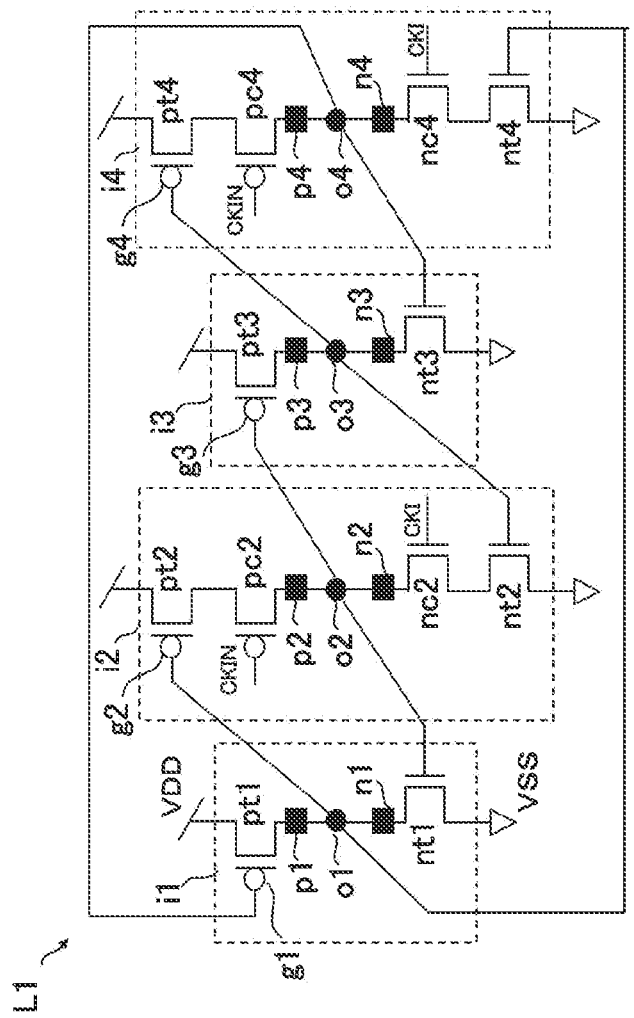
FIG. 6 illustrates an example of a circuit of the semiconductor device according to Embodiment 3.

FIG. 5 illustrates an example of planar disposition of a semiconductor device according to Embodiment 3. FIG. 6 illustrates an example of a circuit of the semiconductor device according to Embodiment 3.

Latch circuit L1 illustrated in FIG. 6 differs from latch circuit L1 illustrated in FIG. 2 in that PMOS transistor pc2 and NMOS transistor nc2 are added to second Inverting circuit i2 and PMOS transistor pc4 and NMOS transistor nc4 are added to fourth inverting circuit i4. The following gives description focusing on differences.

Second inverting circuit i2 and fourth inverting circuit i4 are clocked inverting circuits that receive clock signals. Clock signals CKIN in FIG. 6 denote inverted clock signals that are supplied to the gates of PMOS transistor pc2 and PMOS transistor pc4. Clock signals CKI denote non-inverted clock signals that are supplied to the gates of NMOS transistor nc2 and NMOS transistor nc4.

In the semiconductor device that operates in synchronization with such clock signals CKI and CKIN, a function of disconnecting the connected state of latch circuit L1 is necessary when data held in latch circuit L1 is compulsorily rewritten, and thus second Inverting circuit i2 and fourth inverting circuit i4 that form a feedback path of the latch circuit are configured of clocked inverting circuits. Latch circuit L1 can be used as an element circuit for a flip-flop circuit in which predetermined data can be written. With regard to soft error resistance and an area, advantageous effects similar to those yielded in Embodiment 1 can be obtained.

As described above, in the semiconductor device according to Embodiment 3, at least one of first inverting circuit i1, second inverting circuit i2, third inverting circuit i3, or fourth inverting circuit i4 is a clocked inverting circuit that receives a clock signal.

According to this, the latch circuit that includes clocked inverting circuits can acquire high soft error resistance and have a small area.

Embodiment 4

Embodiment 4 describes an example of a configuration of a master-slave flip-flop circuit that includes two latch circuits each being the latch circuit described in Embodiment 3.

Figure 7:
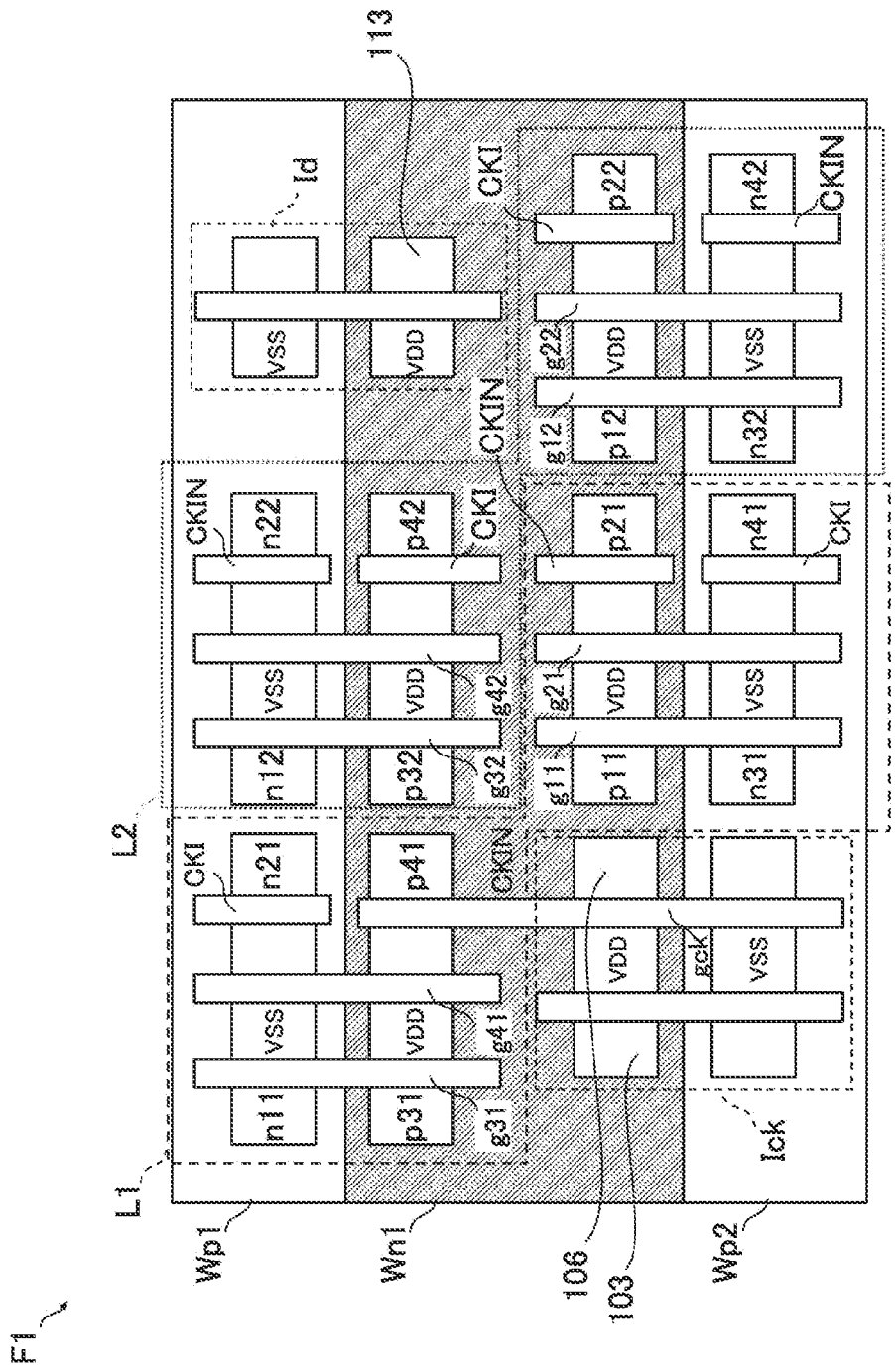
FIG. 7 illustrates an example of planar disposition of a semiconductor device according to Embodiment 4.
Figure 8A:
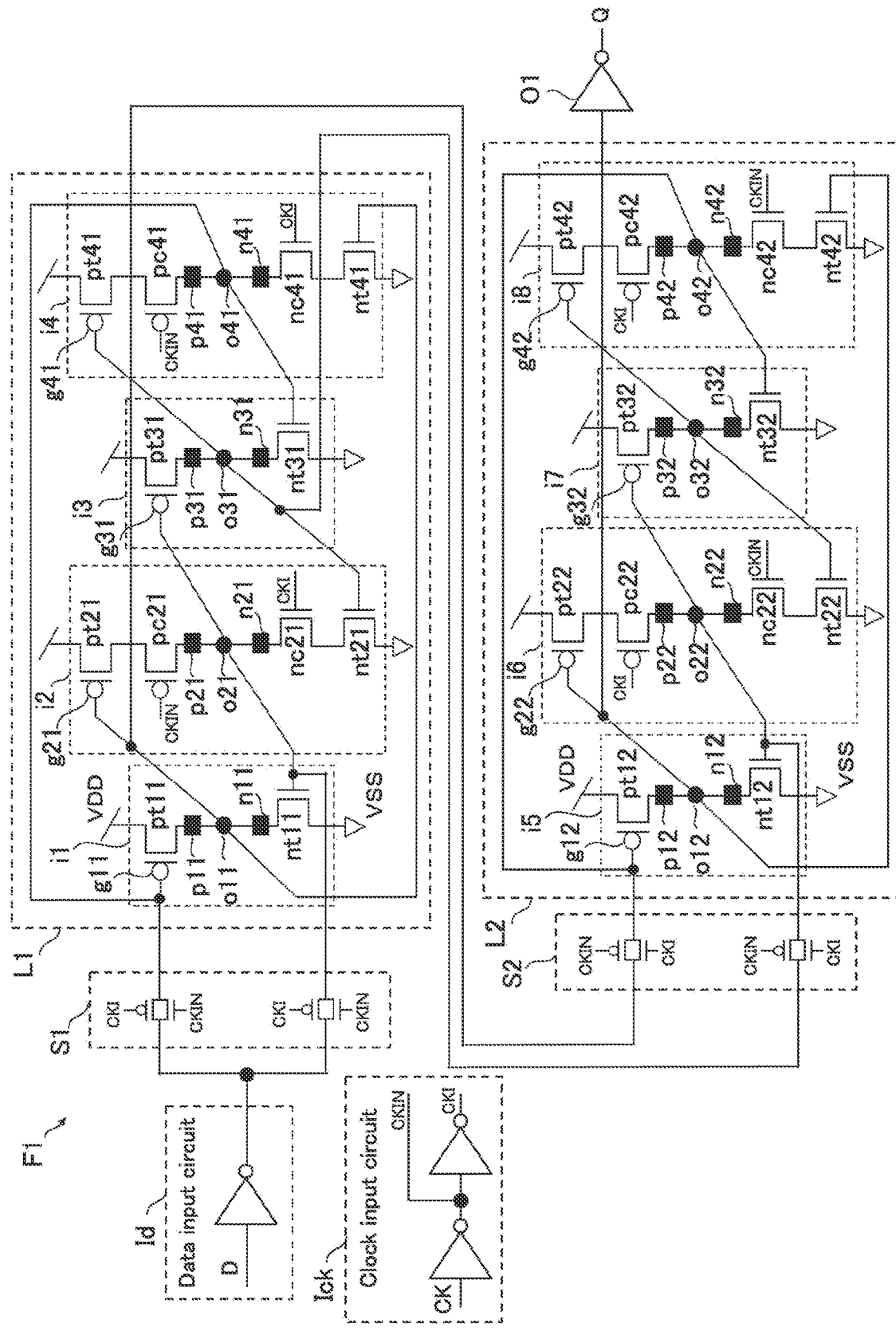
FIG. 8A illustrates an example of a circuit of the semiconductor device according to Embodiment 4.
Figure 8B:
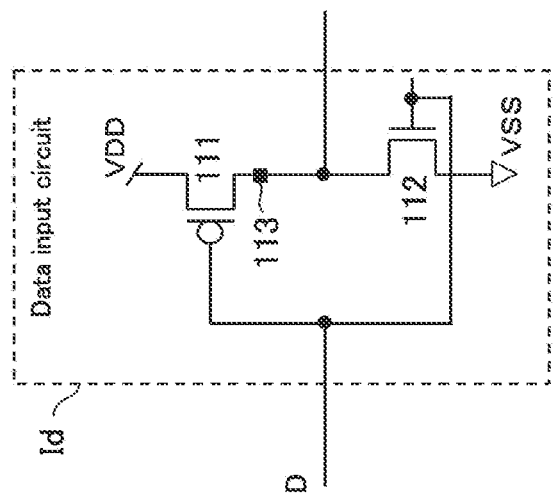
FIG. 8B illustrates an example of a data input circuit in FIG. 8A.
Figure 8C:
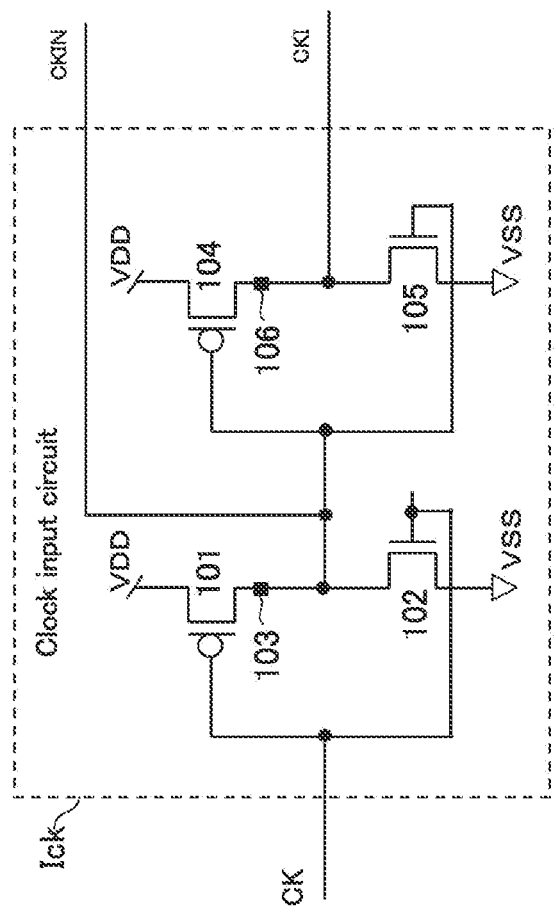
FIG. 8C illustrates an example of a clock input circuit in FIG. 8A.

FIG. 7 illustrates an example of planar disposition of a semiconductor device according to Embodiment 4. FIG. 8A illustrates an example of a circuit of the semiconductor device according to Embodiment 4. FIG. 8B illustrates an example of a data input circuit in FIG. 8A. FIG. 8C illustrates an example of a clock input circuit in FIG. 8A.

In FIG. 8A, flip-flop circuit F1 includes data input circuit Id, clock input circuit Ick, switch circuit S1, switch circuit S2, latch circuit L1, latch circuit L2, and output circuit O1.

Data input circuit Id is an inverting buffer circuit that receives data D and outputs inverted data D.

Clock input circuit Ick receives clock input signal CK, and generates non-inverted clock signal CKI and inverted clock signal CKIN thereof.

Switch circuit S1 is a transfer circuit that transfers and prevents transfer of data from data input circuit Id to latch circuit L1. A transfer state and a transfer-preventing state (or in other words, a connected state and a disconnected state) of switch circuit S1 are controlled according to clock signals CKI and CKIN. In the example in FIG. 8A, switch circuit S1 is in the connected state when clock signal CKI has a low level (clock signal CKIN has a high level then), and is in the disconnected state when clock signal CKI has a high level.

Switch circuit S2 is a transfer circuit that transfers and prevents transfer of data from latch circuit L1 to latch circuit L2. Switch circuit S2 may have the same configuration as that of switch circuit S1. Note that clock signals CKI and CKIN input to switch circuit S2 are switched as compared to switch circuit S1.

Latch circuit L1 has the same configuration as that of latch circuit L1 that includes the clocked inverting circuits as illustrated in FIG. 6.

Latch circuit L2 has the same configuration as that of latch circuit L1 that includes the clocked inverting circuits as illustrated in FIG. 6. Note that clock signals CKI and CKIN Input to latch circuit L2 are switched as compared to latch circuit L1 in FIG. 8A. This is because data is to be sequentially transferred from the master (latch circuit L1) to the slave (latch circuit L2). The four inverting circuits in latch circuit L2 are referred to as fifth inverting circuit i5 to eighth inverting circuit i8.

Fifth inverting circuit i5 includes first-type MOS transistor pt12, second-type MOS transistor nt12, and output node o12 connected to drain p12 of first-type MOS transistor pt12 and the drain of second-type MOS transistor nt12.

Sixth inverting circuit i6 includes first-type MOS transistor pt22, second-type MOS transistor nt22, and output node o22 connected to drain p22 of first-type MOS transistor pt22 and the drain of second-type MOS transistor nt22.

Seventh inverting circuit i7 includes first-type MOS transistor pt32, second-type MOS transistor nt32, and output node o32 connected to drain p32 of first-type MOS transistor pt32 and the drain of second-type MOS transistor nt32.

Eighth inverting circuit i8 includes first-type MOS transistor pt42, second-type MOS transistor nt42, and output node o42 connected to drain p42 of first-type MOS transistor pt42 and the drain of second-type MOS transistor nt42.

Output node o12 of fifth inverting circuit i5 is connected to gate g22 of first-type MOS transistor pt22 in sixth inverting circuit i6 and the gate of second-type MOS transistor nt42 in eighth inverting circuit i8.

Output node o22 of sixth inverting circuit i6 is connected to gate g32 of first-type MOS transistor pt32 in seventh Inverting circuit i7 and the gate of second-type MOS transistor nt12 in fifth inverting circuit i5.

Output node o32 of seventh inverting circuit i7 is connected to gate g42 of first-type MOS transistor pt42 in eighth inverting circuit i8 and the gate of second-type MOS transistor nt22 in sixth inverting circuit i6.

Output node o42 of eighth inverting circuit i8 is connected to gate g12 of first-type MOS transistor pt12 In fifth inverting circuit i5 and the gate of second-type MOS transistor nt32 in seventh Inverting circuit i7.

The drains of first-type MOS transistors pt12, pt22, pt32, and pt42 in fifth to eighth inverting circuits i5 to i8 are all disposed in second-type well region Wn1.

Drains n12 and n22 of second-type MOS transistors nt12 and nt22 in fifth and sixth inverting circuits i5 and 16 are all disposed in first first-type well region Wp1.

Drains n32 and n42 of second-type MOS transistors nt32 and nt42 in seventh and eighth inverting circuits i7 and i8 are all disposed in second first-type well region Wp2.

As illustrated in FIG. 7, in a plan view, the distance between drain p12 of first-type MOS transistor pt12 in fifth inverting circuit i5 and drain p42 of first-type MOS transistor pt42 in eighth inverting circuit i8 is shorter than the distance between drain p12 of first-type MOS transistor pt12 in fifth inverting circuit i5 and drain p32 of first-type MOS transistor pt32 in seventh inverting circuit i7.

Further, in the plan view, out of drain p11 of first-type MOS transistor pt11 in first inverting circuit i1, drain p21 of first-type MOS transistor pt21 in second inverting circuit i2, drain p31 of first-type MOS transistor pt31 in third inverting circuit i3, drain p41 of first-type MOS transistor pt41 in fourth inverting circuit i4, drain p12 of first-type MOS transistor pt12 in fifth inverting circuit i5, drain p22 of first-type MOS transistor pt22 in sixth inverting circuit i6, drain p32 of first-type MOS transistor pt32 in seventh inverting circuit i7, and drain p42 of first-type MOS transistor pt42 in eighth inverting circuit i8, drain p32 of first-type MOS transistor pt32 in seventh inverting circuit i7 is closest to drain p11 of first-type MOS transistor pt11 in first inverting circuit i1, and drain p42 of first-type MOS transistor pt42 in eighth inverting circuit i8 is closest to drain p21 of first-type MOS transistor pt21 in second inverting circuit i2. In other words, drain p11 is disposed close to drain p32. Drain p21 is disposed close to drain p42.

Output circuit O1 is an inverting buffer circuit for outputting data from the latch circuit.

In FIG. 8B, data input circuit Id is an inverter circuit that includes at least first-type MOS transistor 111. Specifically, data input circuit Id includes PMOS transistor 111, NMOS transistor 112, and an output node connected to drain 113 of PMOS transistor 111 and the drain of NMOS transistor 112.

In FIG. 8C, clock input circuit Ick includes inverter circuits in two stages.

The inverter circuits in two stages include at least first-type MOS transistor 101. Specifically, the inverter circuit in the first stage includes PMOS transistor 101, NMOS transistor 102, and an output node connected to drain 103 of PMOS transistor 101 and the drain of NMOS transistor 102.

The inverter circuit in the second stage includes PMOS transistor 104, NMOS transistor 105, and an output node connected to drain 106 of PMOS transistor 104 and the drain of NMOS transistor 105.

The output node in the first stage is connected to the gate of PMOS transistor 104 and the gate of NMOS transistor 105 in the second stage. The output node in the first stage outputs clock signal CKIN. The output node in the second stage outputs clock signal CKI.

In the example of circuit disposition in FIG. 7, one of drain 113 of first-type MOS transistor 111 in data input circuit Id and drain 103 of first-type MOS transistor 101 in clock input circuit Ick is aligned in a first direction with drain p11 of first-type MOS transistor pt11 in first inverting circuit i1 and drain p21 of first-type MOS transistor pt21 In second inverting circuit i2. A remaining one of drain 113 of first-type MOS transistor 111 in data Input circuit Id and drain 113 of first-type MOS transistor 101 in clock input circuit Ick is aligned in the first direction with drain p31 of first-type MOS transistor pt31 in third inverting circuit i3 and drain p41 of first-type MOS transistor pt41 in fourth inverting circuit i4. This disposition allows data input circuit Id and clock input circuit Ick to be disposed efficiently as illustrated in FIG. 7, thus reducing the area of the circuit.

According to the disposition diagram illustrated in FIG. 7 and the circuit diagrams illustrated in FIG. 8A to FIG. 8C, the semiconductor device according to Embodiment 4 includes flip-flop circuit F1 that includes: two latch circuits each being the latch circuit described in Embodiment 3, namely, latch circuits L1 and L2; clock input circuit Ick that receives clock signal CK and generates internal clock signal CKI and inverted signal CKIN thereof; data input circuit Id that receives data input signal D; switch circuit S1 and S2; and output circuit O1.

As illustrated in FIG. 7, in latch circuit L1, drain nodes p11, p21, p31, and p41 of PMOS transistors pt11, pt21, pt31, and pt41 are disposed in N well region (second-type well region) Wn1. Drain nodes n11 and n21 of NMOS transistors nt11 and nt21 are disposed in P well region (first first-type well region) Wp1. Drain nodes n31 and n41 of NMOS transistors nt31 and nt41 are disposed in P well region (second first-type well region) Wp2. Transistors pt 11 and nt31 that include drain nodes p11 and n31 share gate g11. Transistors pt 21 and nt41 that include drain nodes p21 and n41 share gate g21. Transistors pt 31 and nt11 that include drain nodes p31 and n11 share gate g31. Transistors pt41 and nt21 that include drain nodes p41 and n21 share gate g41.

In latch circuit L2, drain nodes p12, p22, p32, and p42 of PMOS transistors pt12, pt22, pt32, and pt42 are disposed in N well region Wn1. Drain nodes n12 and n22 of NMOS transistors nt12 and nt22 are disposed in P well region Wp1. Drain nodes n32 and n42 of NMOS transistors nt32 and nt42 are disposed in P well region Wp2. Transistors pt12 and nt32 that include drain nodes p12 and n32 share gate g12. Transistors pt22 and nt42 that include drain nodes p22 and n42 share gate g22. Transistors pt32 and nt12 that include drain nodes p32 and n12 share gate g32. Transistors pt42 and nt22 that include drain nodes p42 and n22 share gate g42. The example of disposition in FIG. 7 omits at least a portion of the disposition of clock input circuit ICK, data input circuit Id, switch circuits S1 and S2, and output circuit O1.

As illustrated in FIG. 7, in latch circuit L1, the effect of cancelling noise described above is enhanced since the distance between drain nodes p11 and p41 that have different data is shorter than the distance between drain nodes p11 and p31 that have the same data. Furthermore, also in latch circuit L2, the effect of cancelling noise described above is further enhanced since the distance between drain nodes p12 and p42 that have different data is shorter than the distance between drain nodes p12 and p32 that have the same data. As illustrated in FIG. 7, for example, if gate gck that receives internal clock inverted signal CKIN is disposed so as to be shared by a plurality of transistors, the number of connections in the flip-flop circuit can be decreased, which contributes to reduction in the area.

The present embodiment can provide a semiconductor device that includes a flip-flop circuit that is given a small area by disposing drain nodes p11, p21, p31, p41, p12, p22, p32, and p42 in single N well Wn1 and furthermore, acquires high soft error resistance by disposing drain nodes p11, p31, and p41 and drain nodes p12, p32, and p42 in such a manner that noise is cancelled.

As described above, the semiconductor device according to Embodiment 4 includes: second latch circuit L2 that includes fifth inverting circuit i5, sixth inverting circuit i6, seventh inverting circuit i7, and eighth inverting circuit i8, second latch circuit L2 being located downstream of first latch circuit L1. Fifth inverting circuit i5, sixth inverting circuit i6, seventh inverting circuit i7, and eighth inverting circuit i8 each include: first-type MOS transistor pt12/pt22/pt32/pt42; second-type MOS transistor nt12/nt22/nt32/nt42; and output node o12/o22/o32/o42 connected to a drain of the first-type MOS transistor and a drain of the second-type MOS transistor. Output node o12 of fifth inverting circuit i5 is connected to gate g22 of first-type MOS transistor pt22 In sixth inverting circuit i6 and a gate of second-type MOS transistor nt42 in eighth inverting circuit i8. Output node o22 of sixth inverting circuit i6 is connected to gate g32 of first-type MOS transistor pt32 in seventh inverting circuit i7 and a gate of second-type MOS transistor nt12 in fifth inverting circuit i5. Output node o32 of seventh inverting circuit i7 is connected to gate g42 of first-type MOS transistor pt42 In eighth inverting circuit i8 and a gate of second-type MOS transistor nt22 in sixth inverting circuit i6. Output node o42 of eighth inverting circuit i8 is connected to gate g12 of first-type MOS transistor pt12 in fifth inverting circuit i5 and a gate of second-type MOS transistor nt32 in seventh inverting circuit i7. Drain p12 of first-type MOS transistor pt12 in fifth inverting circuit i5, drain p22 of first-type MOS transistor pt22 In sixth inverting circuit i6, drain p32 of first-type MOS transistor pt32 In seventh inverting circuit i7, and drain p42 of first-type MOS transistor pt42 in eighth inverting circuit i8 are disposed in second-type well region Wn1. Drain n12 of second-type MOS transistor nt12 in fifth inverting circuit i5 and drain n22 of second-type MOS transistor nt22 in sixth inverting circuit i6 are disposed in first first-type well region Wp1. Drain n32 of second-type MOS transistor nt32 in seventh inverting circuit i7 and drain n42 of second-type MOS transistor nt42 in eighth inverting circuit i8 are disposed in second first-type well region Wp2. In the plan view, a distance between drain p12 of first-type MOS transistor pt12 in fifth inverting circuit i5 and drain p42 of first-type MOS transistor pt42 in eighth Inverting circuit i8 is shorter than a distance between drain p12 of first-type MOS transistor pt12 In fifth Inverting circuit i5 and drain p32 of first-type MOS transistor pt32 in seventh inverting circuit i7.

According to this, the master-slave flip-flop circuit having high soft error resistance and a small area can be provided.

Here, in the plan view, out of drain p11 of first-type MOS transistor pt11 in first inverting circuit i1, drain p21 of first-type MOS transistor pt21 in second inverting circuit i2, drain p31 of first-type MOS transistor pt31 in third Inverting circuit i3, drain p41 of first-type MOS transistor pt41 in fourth inverting circuit i4, drain p12 of first-type MOS transistor pt12 in fifth inverting circuit i5, drain p22 of first-type MOS transistor pt22 in sixth inverting circuit i6, drain p32 of first-type MOS transistor pt32 in seventh inverting circuit i7, and drain p42 of first-type MOS transistor pt42 in eighth Inverting circuit i8, drain p32 of first-type MOS transistor pt32 In seventh inverting circuit i7 may be closest to drain p11 of first-type MOS transistor pt11 in first inverting circuit i1, and drain p42 of first-type MOS transistor pt42 in eighth inverting circuit i8 may be closest to drain p21 of first-type MOS transistor pt21 in second inverting circuit i2.

According to this, soft error resistance can be increased by adopting circuit disposition as illustrated in FIG. 7, for example.

Here, the semiconductor device may include: data input circuit Id; and clock input circuit Ick. Data input circuit Id may be an inverter circuit that includes at least one first-type MOS transistor 111. Clock input circuit Ick may include inverter circuits i10 and 111 in two stages. Inverter circuits i10 and i11 in the two stages may include at least one first-type MOS transistor 101/104. One of drain 113 of at least one first-type MOS transistor 111 in data input circuit Id and drain 103/106 of at least one first-type MOS transistor 101/104 in clock input circuit Ick may be aligned in a first direction with drain p11 of first-type MOS transistor pt11 in first inverting circuit i1 and drain p21 of first-type MOS transistor pt21 in second inverting circuit i2. A remaining one of drain 113 of at least one first-type MOS transistor 111 in data input circuit Id and drain 103 of at least one first-type MOS transistor 101 in clock input circuit Ick may be aligned in the first direction with drain p31 of first-type MOS transistor pt31 in third inverting circuit i3 and drain p41 of first-type MOS transistor pt41 in fourth inverting circuit i4.

Embodiment 5

Embodiment 5 describes an example of circuit disposition different from that in Embodiment 4.

Figure 9:
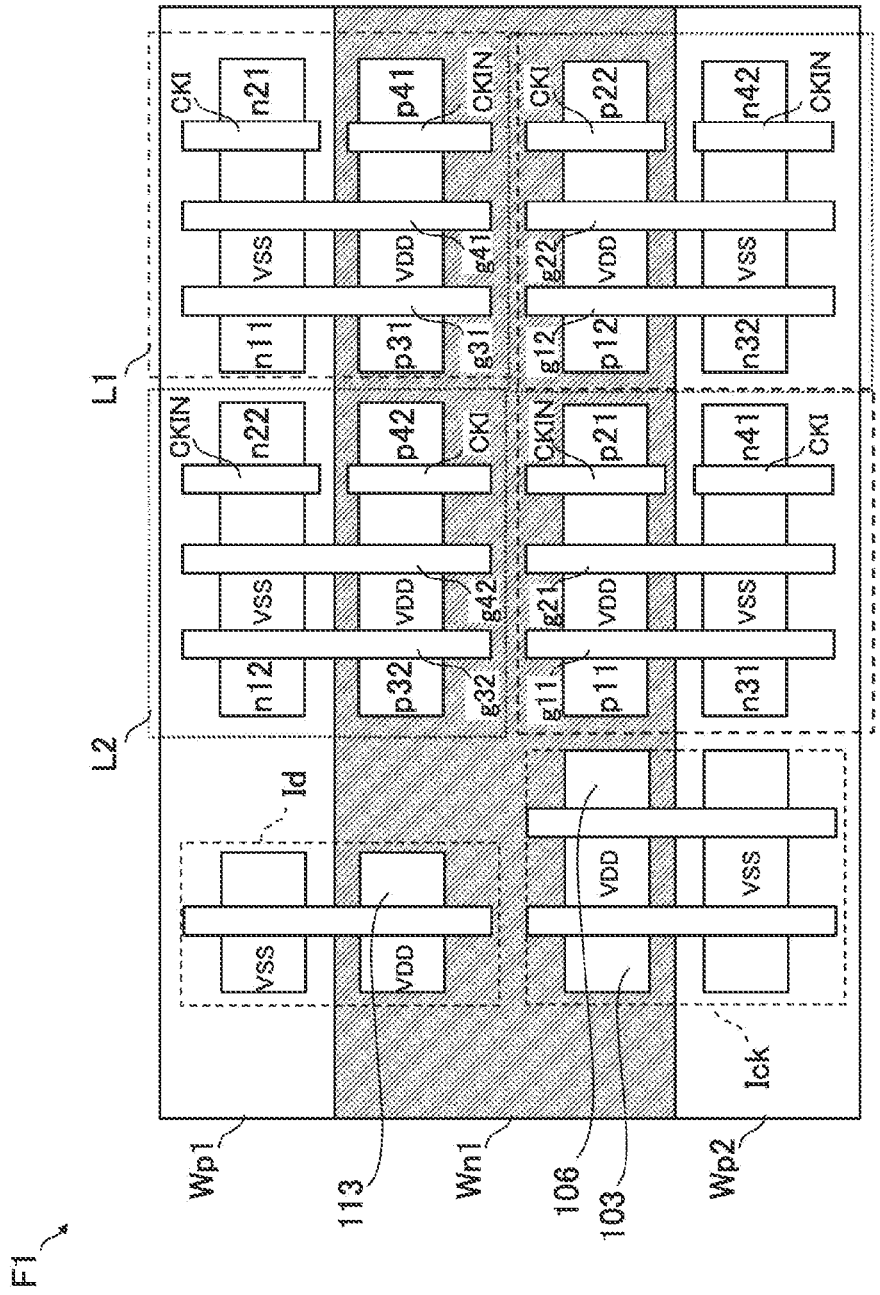
FIG. 9 illustrates an example of planar disposition of a semiconductor device according to Embodiment 5.

FIG. 9 illustrates an example of planar disposition of a semiconductor device according to Embodiment 5. According to the disposition diagram illustrated in FIG. 9, the semiconductor device according to Embodiment 5 is produced by adopting another disposition of the circuit in Embodiment 4. The explanation of numerals in FIG. 9 is the same as that in Embodiment 4, and the effect of increasing soft error resistance is equivalent to that in Embodiment 4. In FIG. 9, the disposition of clock input circuit Ick and data input circuit Id is different from that in FIG. 7. Latch circuits L1 and L2 are disposed so as to be efficiently fit within a single rectangle region.

As illustrated in FIG. 9, in the plan view, out of drain p11 of first-type MOS transistor pt11 in first inverting circuit i1, drain p21 of first-type MOS transistor pt21 in second inverting circuit i2, drain p31 of first-type MOS transistor pt31 in third inverting circuit i3, drain p41 of first-type MOS transistor pt41 in fourth inverting circuit i4, drain p12 of first-type MOS transistor pt12 in fifth inverting circuit i5, drain p22 of first-type MOS transistor pt22 in sixth inverting circuit i6, drain p32 of first-type MOS transistor pt32 in seventh inverting circuit i7, and drain p42 of first-type MOS transistor pt42 in eighth inverting circuit i8, drain p32 of first-type MOS transistor pt32 in seventh inverting circuit i7 is closest to drain p11 of first-type MOS transistor pt11 in first inverting circuit i1. Thus, drain p11 is disposed as close as possible to drain p32.

In the plan view, out of the drains of first to eighth inverting circuits i1 to i8, drain p42 of first-type MOS transistor pt42 in eighth inverting circuit i8 is closest to drain p21 of first-type MOS transistor pt21 in second inverting circuit i2. Thus, drain p21 is disposed as close as possible to drain p42.

In the plan view, out of the drains of first to eighth inverting circuits i1 to i8, drain p12 of first-type MOS transistor pt12 in fifth inverting circuit i5 is closest to drain p31 of first-type MOS transistor pt31 in third inverting circuit i3. Thus, drain p31 is disposed as close as possible to drain p12.

In the plan view, out of the drains of first to eighth inverting circuits i1 to i8, drain p22 of first-type MOS transistor pt22 in sixth inverting circuit i6 is closest to drain p41 of first-type MOS transistor pt41 in fourth inverting circuit i4. Thus, drain p41 is disposed as close as possible to drain p22.

In other words, latch circuit L1 is disposed, being separated into two circuit portions as indicated by the broken line frames. The two circuit portions have substantially the same size. Latch circuit L2 is disposed, being separated into two circuit portions as indicated by the dotted line frames. The two circuit portions have substantially the same size. The four circuit portions of latch circuits L1 and L2 are alternately disposed so as to be efficiently fit in a single rectangle region (a substantially square region). Here, alternately disposing circuit portions means disposing circuit portions in a cross shape, or in other words, checkerwise.

In this manner, by optimizing the disposition of the circuit portions, a semiconductor device that includes a flip-flop circuit that has a small area can be provided while maintaining high soft error resistance.

As described above, in the semiconductor device according to Embodiment 5, in the plan view, out of drain p11 of first-type MOS transistor pt11 in first inverting circuit i1, drain p21 of first-type MOS transistor pt21 in second inverting circuit i2, drain p31 of first-type MOS transistor pt31 in third inverting circuit i3, drain p41 of first-type MOS transistor pt41 in fourth inverting circuit i4, drain p12 of first-type MOS transistor pt12 in fifth inverting circuit i5, drain p22 of first-type MOS transistor pt22 in sixth inverting circuit i6, drain p32 of first-type MOS transistor pt32 in seventh inverting circuit i7, and drain p42 of first-type MOS transistor pt42 in eighth inverting circuit i8, drain p32 of first-type MOS transistor pt32 in seventh inverting circuit i7 is closest to drain p11 of first-type MOS transistor pt11 in first inverting circuit i1, drain p42 of first-type MOS transistor pt42 in eighth inverting circuit i8 is closest to drain p21 of first-type MOS transistor pt21 in second inverting circuit i2, drain p12 of first-type MOS transistor pt12 in fifth inverting circuit i5 is closest to drain p31 of first-type MOS transistor pt31 in third inverting circuit i3, and drain p22 of first-type MOS transistor pt22 in sixth inverting circuit i6 is closest to drain p41 of first-type MOS transistor pt41 in fourth inverting circuit i4.

According to this, soft error resistance can be increased and furthermore, the area of the circuit can be decreased, by adopting circuit disposition as illustrated in FIG. 9, for example.

Embodiment 6

Embodiment 6 describes an example in which the master-slave flip-flop circuit in Embodiment 4 is further given a reset function.

Figure 10:
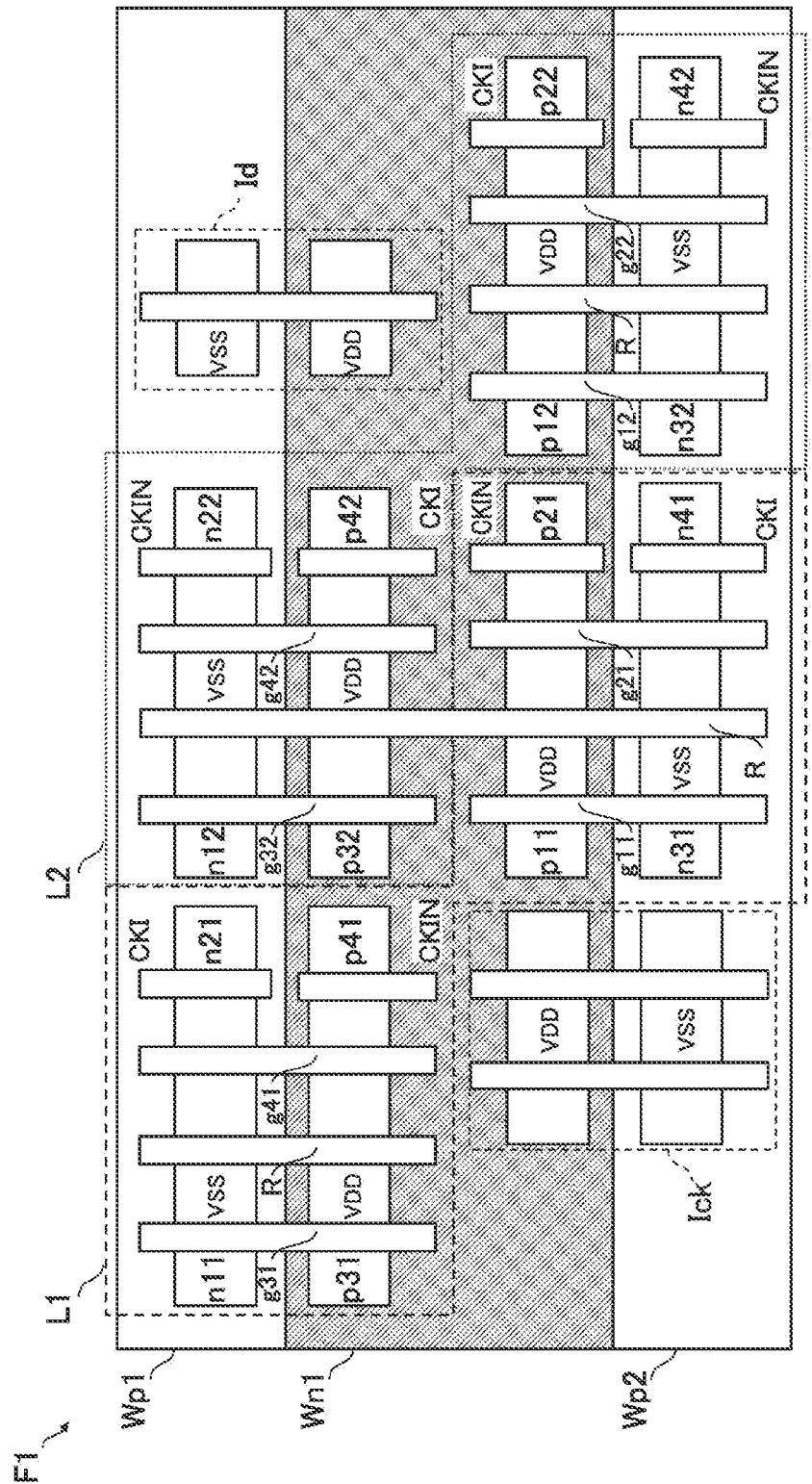
FIG. 10 illustrates an example of planar disposition of a semiconductor device according to Embodiment 6.
Figure 11:
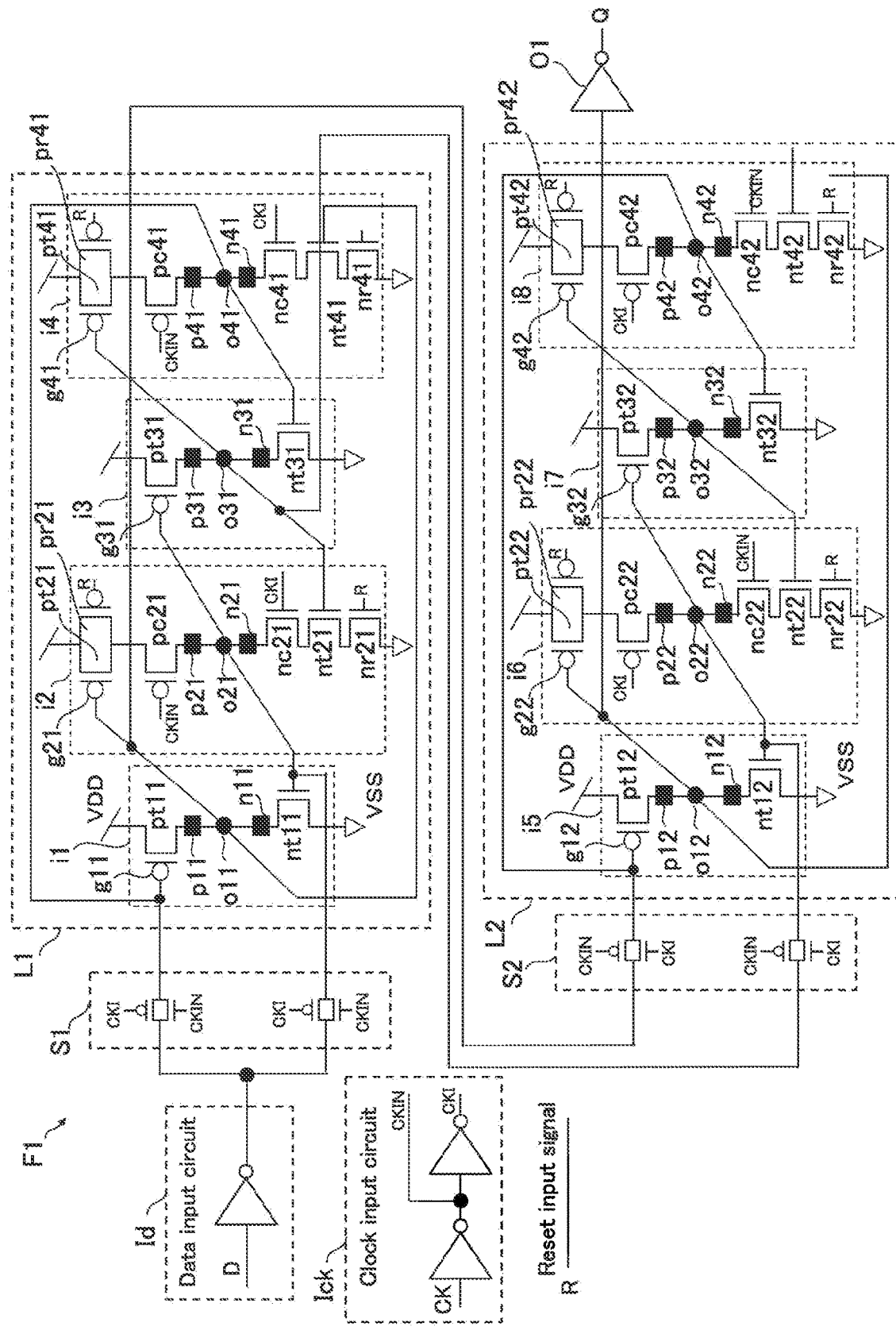
FIG. 11 illustrates an example of a circuit of the semiconductor device according to Embodiment 6.

FIG. 10 illustrates an example of planar disposition of a semiconductor device according to Embodiment 6 of the present disclosure. FIG. 11 illustrates an example of a circuit of the semiconductor device according to Embodiment 6 of the present disclosure.

The example in FIG. 11 differs from the example of the circuit in FIG. 8A in that PMOS transistor pr21 and NMOS transistor nr21 are added to second inverting circuit i2, PMOS transistor pr41 and NMOS transistor nr41 are added to fourth inverting circuit i4, PMOS transistor pr22 and NMOS transistor nr22 are added to sixth inverting circuit i6, and PMOS transistor pr42 and NMOS transistor nr42 are added to eighth inverting circuit i8. The following gives description focusing on differences.

Reset input signals are supplied to the gates of the added PMOS and NMOS transistors.

According to the disposition diagram illustrated in FIG. 10 and the circuit diagram illustrated in FIG. 11, the semiconductor device according to Embodiment 6 is obtained by adding transistors that receive reset input signals R to the semiconductor device according to Embodiment 4, so that second, fourth, sixth, and eighth inverting circuits i2, i4, i6, and i8 having a two-input NAND configuration are given a reset function. The explanation of numerals in FIG. 10 is the same as that in Embodiment 4, and the effect of increasing soft error resistance is equivalent to that in Embodiment 4. As in FIG. 10, by disposing a gate that receives reset input signal R so as to be shared by a plurality of transistors, a semiconductor device that includes a flip-flop circuit that can decrease the number of connections in the flip-flop circuit, contributes to reduction in area, and also has high soft error resistance can be provided.

As described above, in the semiconductor device according to Embodiment 6, at least one of first inverting circuit i1, second inverting circuit i2, third inverting circuit i3, fourth inverting circuit i4, fifth inverting circuit i5, sixth inverting circuit i6, seventh Inverting circuit i7, or eighth Inverting circuit i8 is a NAND-type Inverting circuit that receives a reset signal or a set signal.

According to this, soft error resistance in the flip-flop circuit having a reset function (or a set function) can be increased.

Embodiment 7

The present embodiment relates to a circuit having high soft error resistance, and describes a semiconductor device that addresses problems as follows.

First, the problems are to be specifically described with reference to FIG. 25.

Figure 25:
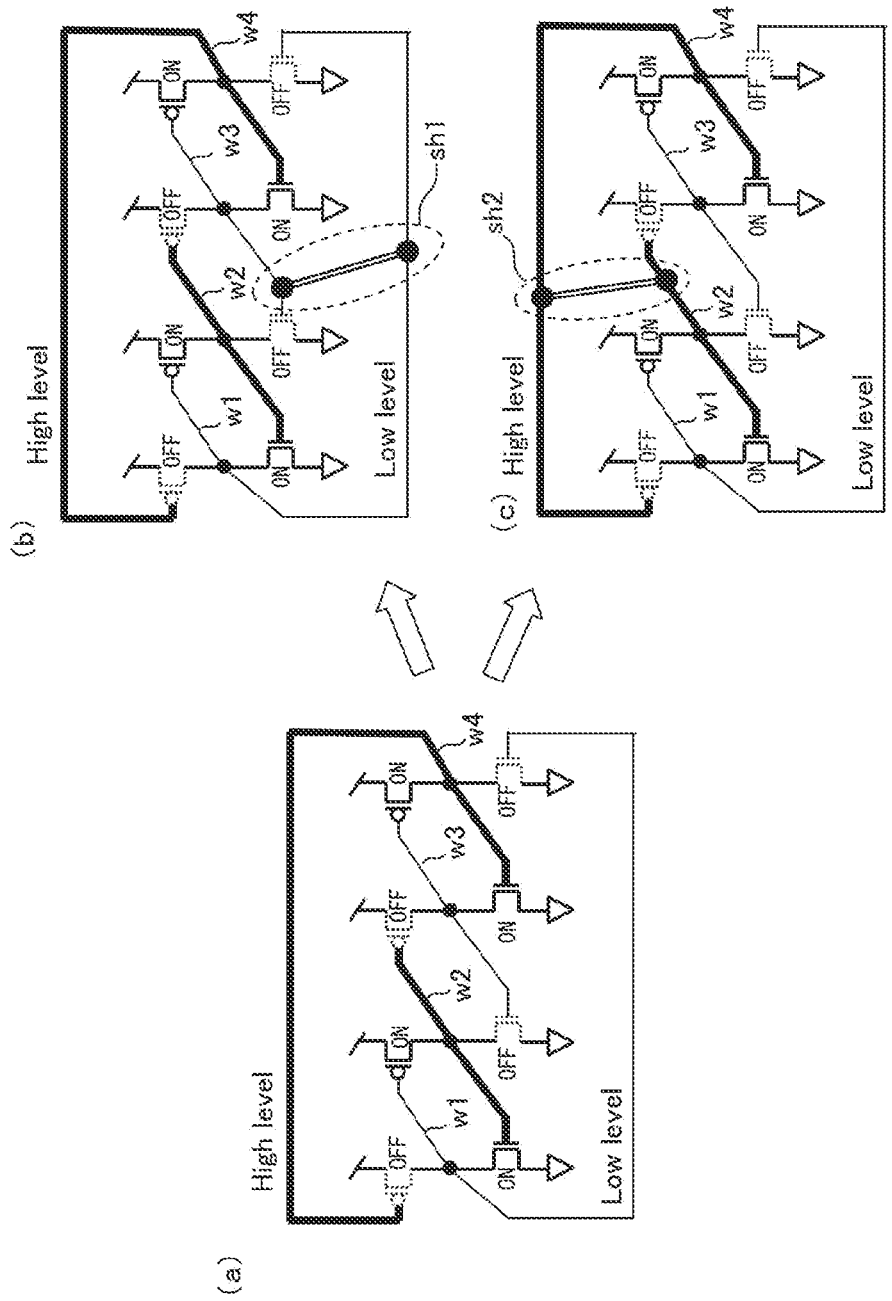
FIG. 25 is an explanatory drawing showing examples of short circuits of a latch circuit in a comparative example.

FIG. 25 is an explanatory drawing showing examples of short circuits of a latch circuit in a comparative example. A latch circuit illustrated in (a) of FIG. 25 includes four PMOS transistors and four NMOS transistors. A pair formed by a PMOS transistor and an NMOS transistor connected in series are included in an inverter circuit.

A normal latch circuit includes two inverter circuits, whereas the latch circuit illustrated in (a) of FIG. 25 includes four inverter circuits. The latch circuit illustrated in (a) of FIG. 25 improves soft error resistance by having a dual-redundant configuration.

In (a) of FIG. 25, the four inverter circuits are connected by four lines w1 to w4. Line w1 and line w3 form a redundant line pair, and have the same signal level, but are independent lines. Similarly, line w2 and line w4 form a redundant line pair, and have the same signal level, but are independent lines.

FIG. 25 illustrates line w1 and line w3 that form a redundant line pair with narrow lines, and shows an example in which the lines have a low level. Furthermore, FIG. 25 illustrates line w2 and line w4 that form another redundant line pair with thick lines, and shows an example in which the lines have a high level.

Signals having the same level are input to the gates of a PMOS transistor and an NMOS transistor in each inverter circuit, but the gates are connected to different lines. Thus, one line of a redundant line pair is connected to the gate of a PMOS transistor. The other line of the redundant line pair is connected to the gate of an NMOS transistor. In this manner, the four inverter circuits form loops, which acquires a structure in which even if output of one inverter circuit is inverted, a correct value is maintained by the other three inverter circuits. Accordingly, the latch circuit in (a) of FIG. 25 increases soft error resistance.

Part (b) of FIG. 25 illustrates that line w1 and line w3 short-circuit as shown by broken-line frame sh1. Part (c) of FIG. 25 illustrates that line w2 and line w4 short-circuit as shown by broken-line frame sh2. In the process of manufacturing a semiconductor device that includes a latch circuit, such a short circuit may occur due to, for example, a conductive foreign substance such as metal particles being mixed into.

In each of (b) and (c) of FIG. 25, a redundant line pair short-circuit. Thus, the line pair that have short-circuited as shown by each of broken-line frames sh1 and sh2 are independent lines not connected to each other, but always have the same signal level when the latch circuit operates. For this reason, the latch circuit normally operates and indicates no anomaly in both (b) and (c) of FIG. 25. However, a problem arises that soft error resistance deteriorates since redundancy of the line pair is lost due to the short circuit.

Furthermore, short circuits shown by broken-line frames sh1 and sh2 cannot be detected in an inspection stage in the process of manufacturing a semiconductor device. Thus, there is a problem that deterioration in soft error resistance caused by short circuits shown by broken-line frames sh1 and sh2 cannot be detected.

In view of this, the present disclosure provides a semiconductor device that reduces deterioration in soft error resistance caused by a short circuit of a redundant line pair.

In order to solve such a problem, a semiconductor device according to an aspect of the present disclosure includes: a first line; a second line that is not connected to the first line and is redundantly provided to transfer a signal having a level same as a level of a signal transferred through the first line; and another line different from the first line and the second line. In a line layer, a distance between the first line and the second line is longer than a distance between the first line and the other line, and is longer than a distance between the second line and the other line.

According to this, deterioration in soft error resistance caused by a short circuit of a redundant line pair can be reduced. That is because if a foreign substance having approximately the same size as a distance between lines is mixed into, a short circuit between the other line and the first line or the second line is more likely to occur than a short circuit between the first line and the second line. As a result, an undetectable short circuit can be prevented from occurring, or stated differently, a redundant line pair can be prevented from short-circuiting.

If the first line or the second line and the other line short-circuit due to a foreign substance being mixed into, a probability that an abnormal operation is caused is high, and thus a short circuit can be detected in the inspection stage before factory shipment.

Thus, deterioration in soft error resistance caused by a short circuit of a redundant line pair can be reduced.

The following specifically describes embodiments with reference to the drawings.

7.1 Example of Circuit of Semiconductor Device

Figure 12:
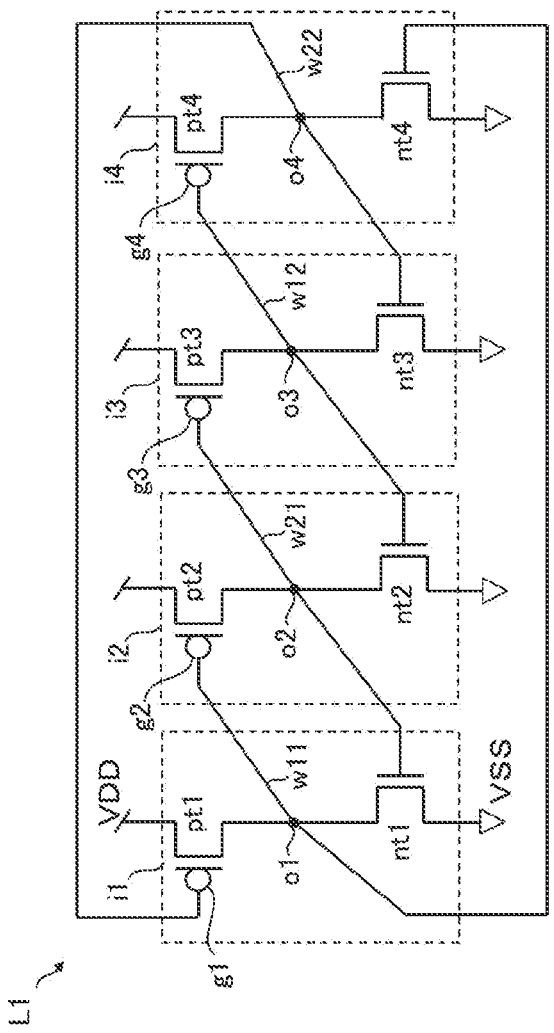
FIG. 12 illustrates an example of a circuit formed in the semiconductor device according to Embodiment 1.

FIG. 12 illustrates an example of a circuit formed in the semiconductor device according to Embodiment 1.

FIG. 12 differs from FIG. 2 in that reference signs that denote drains p1 to p4 are omitted and reference signs that denote lines w11, w12, w21, and w22 are added. The following gives description focusing on differences.

The first to fourth inverting circuits are connected by four lines w11, w12, w21, and w22. Line w11 and line w12 form a redundant line pair, and have the same signal level, but are independent lines that are not connected to each other. Similarly, line w21 and line w22 form a redundant line pair, and have the same signal level, but are independent lines that are not connected to each other. Note that the lines included in a redundant line pair indicate not only metal line portions in a line layer, but also series of conductors including, for instance, via contacts between line layers, electrodes of gates, sources, and drains of transistors, and terminal electrodes of circuit elements. In the following, a "via contact" may be simply referred to as a "via".

Line w11 connects output node o1 of first inverting circuit i1 to gate g2 of first-type MOS transistor pt2 in second inverting circuit i2 and the gate of second-type MOS transistor nt4 in fourth inverting circuit i4.

Line w21 connects output node o2 of second inverting circuit i2 to gate g3 of first-type MOS transistor pt3 in third inverting circuit i3 and the gate of second-type MOS transistor nt1 in first inverting circuit i1.

Line w12 connects output node o3 of third inverting circuit i3 to gate g4 of first-type MOS transistor pt4 in fourth inverting circuit i4 and the gate of second-type MOS transistor nt2 in second inverting circuit i2.

Line w22 connects output node o4 of fourth inverting circuit i4 to gate g1 of first-type MOS transistor pt1 in first inverting circuit i1 and the gate of second-type MOS transistor nt3 in third inverting circuit i3.

Such connection allows the four inverter circuits to form loops. Accordingly, this acquires a structure in which even if the output of one inverter circuit is inverted due to a soft error, a correct value is maintained by the other three inverter circuits. Accordingly, latch circuit L1 in FIG. 12 increases soft error resistance.

Latch circuit L1 illustrated in FIG. 12 forms a portion of a semiconductor circuit formed on a semiconductor substrate in the semiconductor device. The semiconductor circuit formed on the semiconductor substrate includes, for instance, a plurality of p-type impurity regions, a plurality of n-type impurity regions, a plurality of line layers, and a plurality of contacts that connect the line layers.

The redundant line pairs that are elements of latch circuit L1 in FIG. 12 are formed in one or more line layers. In the present embodiment, a redundant line pair is disposed so as to prevent the redundant line pair from short-circuiting due to a foreign substance being mixed into in the process of manufacturing the semiconductor device.

Next, a line layout of a redundant line pair in a single line layer is to be described.

7.2.1 First Example of Line Layout in Line Layer

Figure 13:
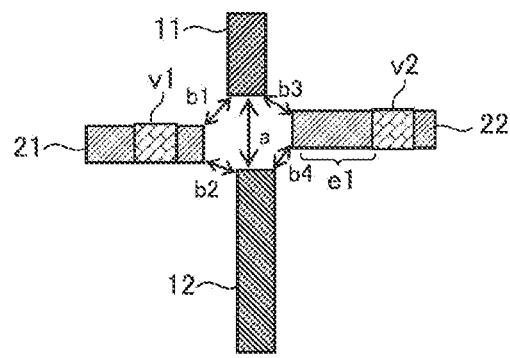
FIG. 13 illustrates a first example of a line layout in a line layer.

FIG. 13 illustrates a first example of a line layout in a line layer of the semiconductor device. FIG. 13 is a plan view of the semiconductor substrate on which latch circuit L1 in FIG. 12 is formed. Furthermore, FIG. 13 is a schematic enlarged view of some lines out of a plurality of lines formed in a single line layer. FIG. 13 illustrates a layout of four lines 11, 12, 21, and 22.

Line 11 and line 12 indicate a redundant line pair. Specifically, line 12 is not connected to line 11, and is redundantly provided to transfer a signal having the same level as the level of a signal transferred through line 11. Line 11 and line 12 correspond to line w11 and line w12 in FIG. 12, for example.

Line 21 is another line different from lines 11 and 12. Line 22 is also a line different from lines 11 and 12.

In FIG. 13, sign a denotes a distance between line 11 and line 12. Sign b1 denotes a distance between line 11 and line 21. Sign b2 denotes a distance between line 12 and line 21. Sign b3 denotes a distance between line 11 and line 22. Sign b4 denotes a distance between line 12 and line 22. Note that the distances are shortest distances between lines.

The layout of those lines satisfies the following relations.

Distance a between line 11 and line 12 is longer than distance b1 between line 11 and line 21.

Distance a between line 11 and line 12 is longer than distance b2 between line 12 and line 21.

Distance a between line 11 and line 12 is longer than distance b3 between line 11 and line 22.

Distance a between line 11 and line 12 is longer than distance b4 between line 12 and line 22.

By satisfying such relations, if a foreign substance is mixed into, line 11 or 12 and another line (21, 22) are more likely to short-circuit than a short circuit between lines 11 and 12 that form a redundant line pair. As a result, an undetectable short circuit can be prevented from occurring, or stated differently, a redundant line pair can be prevented from short-circuiting.

Line 11 or 12 and another line (21, 22) are more likely to short-circuit, and thus the short circuit can be detected. Accordingly, deterioration in soft error resistance caused by a short circuit of a redundant line pair can be reduced.

In FIG. 13, line 22 includes extending portion e1 that extends from via v2 connected to a body portion of line 22. An end of extending portion e1 may be an open end that is not connected in the line layer.

Note that line 21 and line 22 in FIG. 13 may correspond to line w21 and line w22 In FIG. 12, for example. Alternatively, line 21 and line 22 may each be a power line or a ground line.

7.2.2 Second Example of Line Layout in Line Layer

Figure 14:
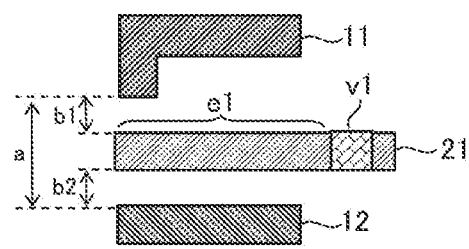
FIG. 14 illustrates a second example of a line layout in a line layer.

FIG. 14 illustrates a second example of a line layout in a line layer. FIG. 14 is a schematic enlarged view of some lines out of a plurality of lines formed in a single line layer. FIG. 14 illustrates a layout of lines 11, 12, and 21. Sign v1 in FIG. 14 denotes a via contact that connects line 21 to a line in another line layer. Sign e1 denotes an extending portion of line 21.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 14 satisfies the following relation similarly to FIG. 13.

Distance a between line 11 and line 12 is longer than distance b1 between line 11 and line 21.

Distance a between line 11 and line 12 is longer than distance b2 between line 12 and line 21.

In FIG. 14, line 11 and line 12 that form a redundant line pair are disposed with another line 21 being located therebetween throughout the parallel section in which lines 11 and 12 are disposed parallel to each other. Accordingly, line 21 includes extending portion e1. Thus, line 21 includes extending portion e1 that extends from via v1 connected to a body portion of line 21. Extending portion e1 is disposed between line 11 and line 12 in the parallel section. Further, an end of extending portion e1 may be an open end that is not connected in the line layer.

According to the example of the line layout in FIG. 14, if a foreign substance is mixed into, line 11 or 12 and another line 21 are more likely to short-circuit before line 11 and line 12 that form a redundant line pair short-circuit. Stated differently, a probability that a detectable short circuit occurs instead of a short circuit of a redundant line pair is high.

Accordingly, deterioration in soft error resistance caused by a short circuit of a redundant line pair can be reduced.

Note that line 21 in FIG. 14 may be a line corresponding to one of lines w21 and w22 in FIG. 12, a power line, or a ground line, for example.

7.2.3 Third Example of Line Layout in Line Layer

Figure 15:
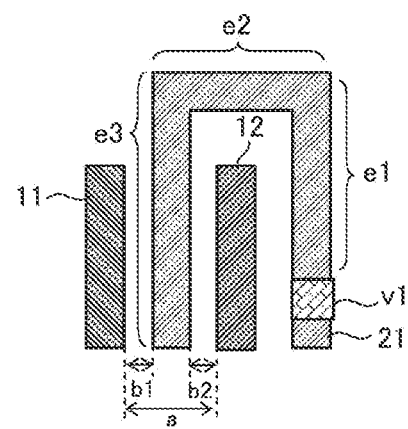
FIG. 15 illustrates a third example of a line layout in a line layer.

FIG. 15 illustrates a third example of a line layout in a line layer. FIG. 15 is a schematic enlarged view of some lines out of a plurality of lines formed in a single line layer. FIG. 15 illustrates a layout of lines 11, 12, and 21. Sign v1 in FIG. 15 denotes a via contact that connects line 21 to a line in another line layer.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 15 also satisfies the following relations similarly to FIG. 13.

Distance a between line 11 and line 12 is longer than distance b1 between line 11 and line 21.

Distance a between line 11 and line 12 is longer than distance b2 between line 12 and line 21.

In FIG. 15, line 11 and line 12 that form a redundant line pair are disposed with another line 21 being located therebetween throughout the parallel section in which lines 11 and 12 are disposed parallel to each other. Accordingly, line 21 includes extending portions e1 to e3. Thus, line 21 includes extending portions e1 to e3 that extend from via v1 connected to a body portion of line 21. Extending portions e1 to e3 are continuous to form a single line, and are disposed, bypassing an end portion of line 12 in the line layer. A portion of extending portion e3 is disposed so as to be located between line 11 and line 12 throughout the parallel section. Further, an end of extending portion e3 may be an open end that is not connected in the line layer. Distances b1 and b2 in FIG. 15 may each be a shortest interval between lines specified by a design rule of the semiconductor device. Distance a between line 11 and line 12 is longer than the shortest interval between lines specified by the design rule.

According to the example of the line layout in FIG. 15, if a foreign substance is mixed into, line 11 or 12 and another line 21 are more likely to short-circuit before line 11 and line 12 that form a redundant line pair short-circuit. Stated differently, a probability that a detectable short circuit occurs instead of a short circuit of a redundant line pair is high. Accordingly, deterioration in soft error resistance caused by a short circuit of a redundant line pair can be reduced.

Note that line 21 in FIG. 15 may be a line corresponding to one of lines w21 and w22 in FIG. 12, a power line, or a ground line, for example.

7.2.4 Fourth Example of Line Layout in Line Layer

Figure 16:
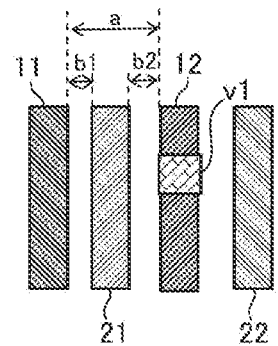
FIG. 16 illustrates a fourth example of a line layout in a line layer.

FIG. 16 illustrates a fourth example of a line layout in a line layer. FIG. 16 is a schematic enlarged view of some lines out of a plurality of lines formed in a single line layer. FIG. 16 illustrates a layout of lines 11, 12, 21, and 22. Sign v1 in FIG. 16 denotes a via contact that connects line 21 to a line in another line layer.

Line 11 and line 12 indicate a redundant line pair. Line 21 and line 22 indicate a redundant line pair. A line pair of lines 11 and 12 is referred to as a first redundant pair, and a line pair of lines 21 and 22 is referred to as a second redundant pair. In FIG. 16, four lines 11, 12, 21, and 22 are disposed such that line 11 that is one line of the first redundant pair, line 21 that is one line of the second redundant pair, line 12 that is the other line of the first redundant pair, and line 22 that is the other line of the second redundant pair are disposed in this order. Thus, the lines of the two redundant pairs are alternately disposed, and lines having the same signal level are not next to each other.

An example of the line layout in FIG. 16 also satisfies the following relations similarly to FIG. 13.

Distance a between line 11 and line 12 is longer than distance b1 between line 11 and line 21.

Distance a between line 11 and line 12 is longer than distance b2 between line 12 and line 21.

Lines 11, 12, 21, and 22 in FIG. 16 may each be a body portion or an extending portion of a line.

According to the example of the line layout in FIG. 16, if a foreign substance is mixed into, line 11 or 12 and another line 21 or 22 are more likely to short-circuit before line 11 and line 12 that form a redundant line pair short-circuit. Stated differently, a probability that a detectable short circuit occurs instead of a short circuit of a redundant line pair is high. Accordingly, deterioration in soft error resistance caused by a short circuit of a redundant line pair can be reduced.

Note that lines 11 and 12 in FIG. 16 may correspond to line w11 and line w12 in FIG. 12, and line 21 and line 22 may correspond to line w21 and line w22 in FIG. 12.

7.2.5 Fifth Example of Line Layout in Line Layer

Figure 17:
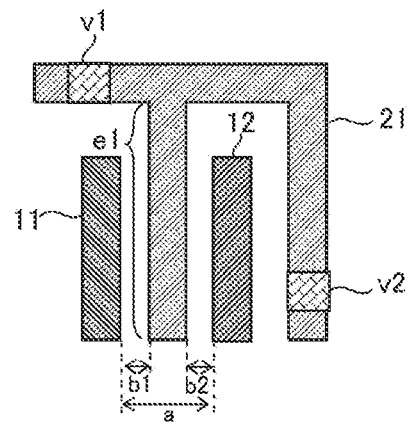
FIG. 17 illustrates a fifth example of a line layout in a line layer.

FIG. 17 illustrates a fifth example of a line layout in a line layer. FIG. 17 is a schematic enlarged view of some lines out of a plurality of lines formed in a single line layer. FIG. 17 illustrates a layout of lines 11, 12, and 21. Signs v1 and v2 in FIG. 17 each denote a via contact that connects line 21 to a line in another line layer. Sign e1 denotes an extending portion of line 21.

Line 11 and line 12 indicate a redundant line pair. Line 21 is another line different from lines 11 and 12. The line layer includes a parallel section in which lines 11 and 12 that form a redundant line pair are disposed parallel to each other, and another line 21 is located between line 11 and line 12 throughout the parallel section.

An example of the line layout in FIG. 17 satisfies the following relation similarly to FIG. 13.

Distance a between line 11 and line 12 is longer than distance b1 between line 11 and line 21.

Distance a between line 11 and line 12 is longer than distance b2 between line 12 and line 21.

In FIG. 17, line 11 and line 12 that form a redundant line pair are disposed with another line 21 being located therebetween throughout the parallel section in which lines 11 and 12 are disposed parallel to each other. Accordingly, line 21 includes extending portion e1. Thus, line 21 includes extending portion e1 that extends from a body portion of line 21. Extending portion e1 is disposed between line 11 and line 12 in the parallel section. Further, an end of extending portion e1 may be an open end that is not connected in the line layer.

According to the example of the line layout in FIG. 17, if a foreign substance is mixed into, line 11 or 12 and another line 21 are more likely to short-circuit than a short circuit between line 11 and line 12 that form a redundant line pair. Stated differently, a probability that a detectable short circuit occurs instead of a short circuit of a redundant line pair is high. Accordingly, deterioration in soft error resistance caused by a short circuit of a redundant line pair can be reduced.

Note that line 21 in FIG. 17 may be a line corresponding to one of lines w21 and w22 in FIG. 12, a power line, or a ground line, for example.

7.2.6 Sixth Example of Line Layout in Line Layer

Figure 18:
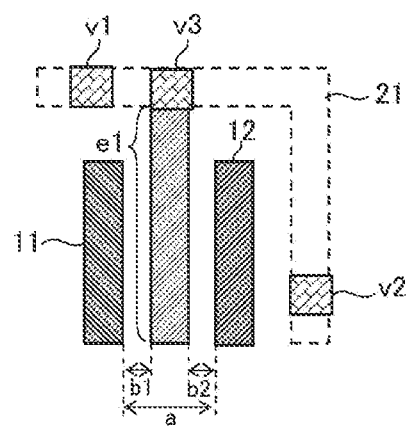
FIG. 18 illustrates a sixth example of a line layout in a line layer.

FIG. 18 illustrates a sixth example of a line layout in a line layer. The example in FIG. 18 is different from that in FIG. 17 in that the body portion of line 21 is included in another line layer and extending portion e1 extends from the body portion of line 21 through via v3. The following gives description focusing on differences.

The body portion of line 21 is included in another line layer different from the line layer that includes line 11 and line 12, as indicated by the broken lines in FIG. 18.

Extending portion e1 extends from the body portion of line 21 included in the other line layer through via v3. Accordingly, the line layer includes a parallel section in which lines 11 and 12 that form a redundant line pair are disposed parallel to each other, and extending portion e1 of another line 21 is located between line 11 and line 12 throughout the parallel section.

According to the example of the line layout in FIG. 18, deterioration in soft error resistance caused by a short circuit of the redundant line pair can be reduced, similarly to FIG. 17.

7.2.7 Seventh Example of Line Layout in Line Layer

Figure 19:
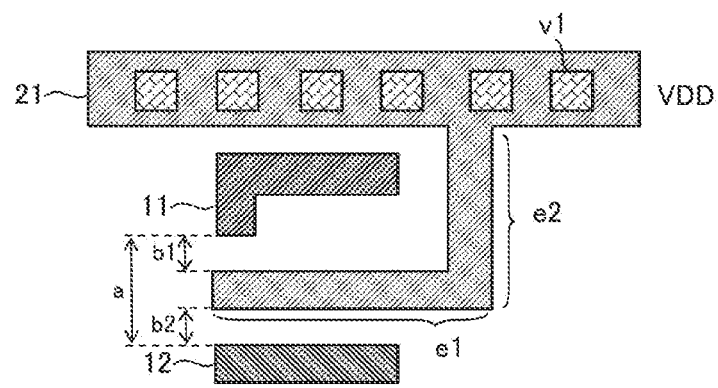
FIG. 19 illustrates a seventh example of a line layout in a line layer.

FIG. 19 illustrates a seventh example of a line layout in a line layer. The example in FIG. 19 is different from that in FIG. 14 in that a power line is additionally provided. The following gives description focusing on differences.

Line 21 is a power line, and includes extending portions e1 and e2 that extend from the body portion of the power line. The power line may be a line that surrounds the entirety or a portion of latch circuit L1 in the line layer or a shield line formed in another line layer, for example.

According to the example of the line layout in FIG. 19, deterioration in soft error resistance caused by a short circuit of the redundant line pair can be reduced, similarly to FIG. 14.

7.2.8 Eighth Example of Line Layout in Line Layer

Figure 20:
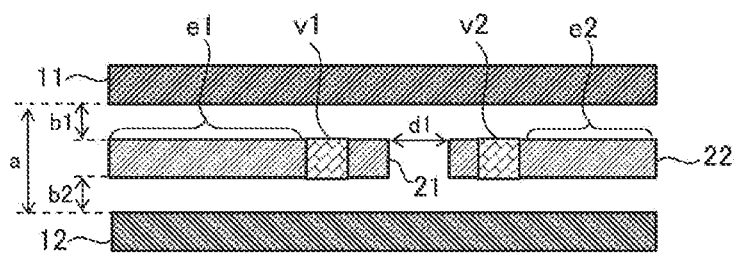
FIG. 20 illustrates an eighth example of a line layout in a line layer.

FIG. 20 illustrates an eighth example of a line layout in a line layer. FIG. 20 is a schematic enlarged view of some lines out of a plurality of lines formed in a single line layer. FIG. 20 illustrates a layout of lines 11, 12, 21, and 22. Sign v1 in FIG. 20 denotes a via contact that connects line 21 to a line in another line layer. Sign v2 denotes a via contact that connects line 22 to a line in another line layer. Sign e1 denotes an extending portion of line 21. Sign e2 denotes an extending portion of line 22.

Line 11 and line 12 indicate a redundant line pair. Line 21 is another line different from lines 11 and 12. Line 22 is another line different from lines 11 and 12. Line 21 and line 22 do not form a redundant line pair. The line layer includes a parallel section in which lines 11 and 12 that form a redundant line pair are disposed parallel to each other, and another line 21 and different another line 22 are located between line 11 and line 12 throughout most of the parallel section. Another line 21 and different another line 22 are disposed on the same straight line with space (distance dl) being provided therebetween.

An example of the line layout in FIG. 20 satisfies the following relation similarly to FIG. 13.

Distance a between line 11 and line 12 is longer than distance b1 from line 11 to lines 21 and 22.

Distance a between line 11 and line 12 is longer than distance b2 from line 12 to lines 21 and 22.

Furthermore, in FIG. 20, distance a between line 11 and line 12 is longer than distance dl between line 21 and line 22. Stated differently, distance dl of a section in which line 11 and line 12 are next and parallel to each other (that is, a section in which the lines do not have another line located therebetween) is shorter than distance a between line 11 and line 12. Further stated differently, the line layer includes a section in which line 11 and line 12 are disposed parallel to each other with line 21 and line 22 being located therebetween. In the section, distance dl between line 21 and line 22 is shorter than distance a between line 11 and line 12.

In FIG. 20, line 11 and line 12 that form a redundant line pair are disposed with line 21 and line 22 being located therebetween throughout most of the parallel section in which lines 11 and 12 are disposed parallel to each other. Accordingly, line 21 includes extending portion e1, and line 22 includes extending portion e2. Thus, ends of extending portions e1 and e2 may be open ends that are not connected in the line layer.

According to the example of the line layout in FIG. 20, deterioration in soft error resistance caused by a short circuit of the redundant line pair can be reduced, similarly to FIG. 14.

Note that line 21 in FIG. 20 may be a power line or a ground line, for example. Line 22 may be a power line or a ground line, for example.

FIG. 13 to FIG. 20 each illustrate an example of a disposition layout of a redundant line pair in a single line layer. The following describes disposition layouts of redundant line pairs in different line layers.

7.3.1 First Example of Line Layout in Line Layers

Figure 21:
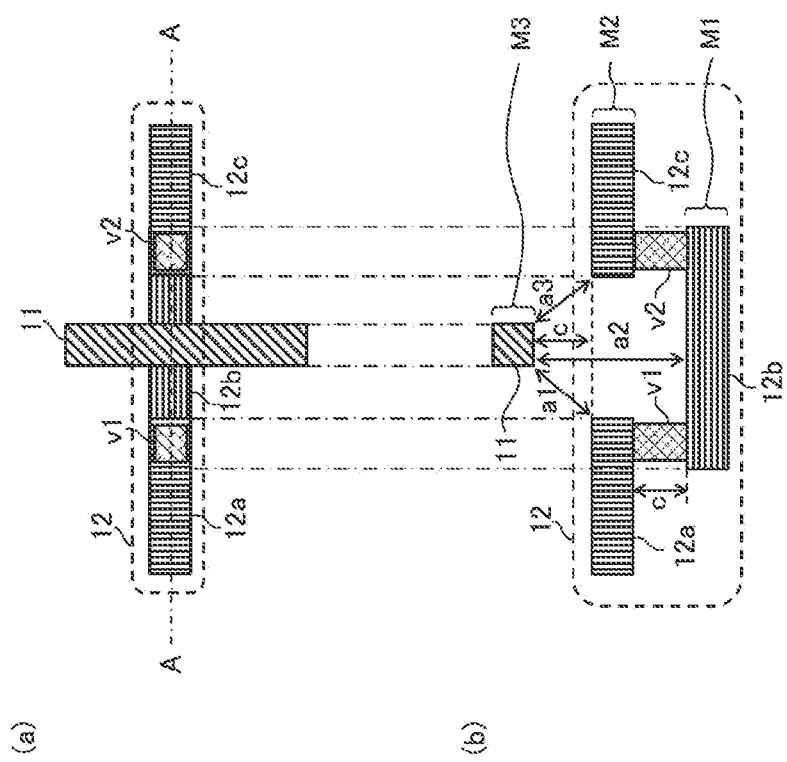
FIG. 21 illustrates a first example of a line layout in line layers.

FIG. 21 illustrates a first example of a line layout in line layers. Part (a) of FIG. 21 illustrates a line layout in a plan view of a semiconductor substrate on which latch circuit L1 is formed. Part (b) of FIG. 21 illustrates a cross section taken along line A-A, and includes three line layers M1 to M3. Part (b) of FIG. 21 is a schematically enlarged view of a portion related to a redundant line pair out of lines formed in line layers M1 to M3. FIG. 21 illustrates line 11 and line 12 that form a redundant line pair.

As illustrated in FIG. 21, line 11 and line 12 that form a redundant line pair are included in different line layers. Thus, line 11 is included in line layer M3, and line 12 is included in line layers M2 and M1 and includes via contacts.

A redundant line pair in different line layers are disposed, satisfying the following relation. Specifically, when different line layers include line 11 and line 12, distance a between line 11 and line 12 is longer than interlayer distance c between line layers next to each other. In FIG. 21, a1, a2, and a3 are denoted as three distances between line 11 and line 12, and distance a between line 11 and line 12 is a1 or a3 that denotes the shortest distance. Line 11 and line 12 are disposed, satisfying a>c.

To provide more detailed description, in FIG. 21, the semiconductor device includes, in a plan view thereof, an overlapping portion in which line 11 and line 12 overlap and cross each other. Line 12 includes first partial line 12b in which the overlapping portion is included, second partial line 12a connected to a first end of first partial line 12b, and third partial line 12c connected to a second end of first partial line 12b. First partial line 12b is included in line layer M1. Second partial line 12a and third partial line 12c are included in line layer M2 different from line layer M1, and connected to first partial line 12b through via contacts v1 and v2, respectively. Line 11 is included in line layer M3 farther from line layer M1 than from line layer M2. This disposition layout readily allows the above relation (that is, a>c) to be satisfied. In FIG. 21, lines 11 and 12 are disposed such that a relation that distance a2 between line 11 and line 12 in the overlapping portion is at least twice interlayer distance c is satisfied.

According to the disposition layout in FIG. 21, deterioration in soft error resistance caused by a short circuit of the redundant line pair can be reduced. That is because if a foreign substance having substantially the same size as interlayer distance c is mixed into, lines 11 and 12 are less likely to short-circuit. Accordingly, a short circuit of a redundant line pair can be prevented from occurring.

Note that line layers M1 to M3 in FIG. 21 may be any three layers out of a plurality of line layers, as long as line layers M1 to M3 are disposed in this order. Note that interlayer distance c is not limited to the distance between line layer M2 and line layer M3 in FIG. 21, and is the shortest distance between two line layers next to each other.

7.3.2 Second Example of Line Layout in Line Layers

Figure 22A:
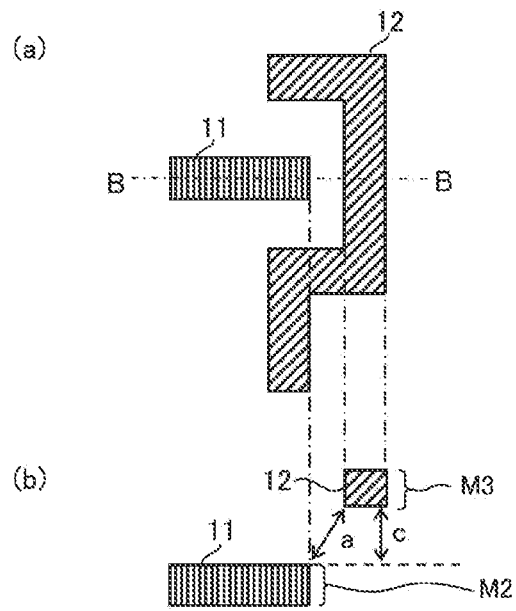
FIG. 22A illustrates a second example of a line layout in line layers.

FIG. 22A illustrates a second example of a line layout in line layers. Part (a) of FIG. 22A illustrates a line layout in a plan view of a semiconductor substrate on which latch circuit L1 is formed. Part (b) of FIG. 22A illustrates a cross section taken along line B-B in (a) of FIG. 22A, and includes two line layers M2 and M3. Part (b) of FIG. 22A is a schematically enlarged view of a portion related to a redundant line pair out of lines formed in line layers M2 and M3. FIG. 22A illustrates line 11 and line 12 that form a redundant line pair.

In a plan view illustrated in (a) of FIG. 22A, line 12 bypasses an end portion of line 11 so as not to overlap line 11.

This disposition layout readily allows the above relation (that is, a>c) to be satisfied.

According to the disposition layout in FIG. 22A, deterioration in soft error resistance caused by a short circuit of the redundant line pair can be reduced. That is because if a foreign substance having substantially the same size as interlayer distance c is mixed into, lines 11 and 12 are less likely to short-circuit. Accordingly, a short circuit of a redundant line pair can be prevented from occurring.

7.3.3 Second Example of Line Layout in Line Layers

Figure 22B:
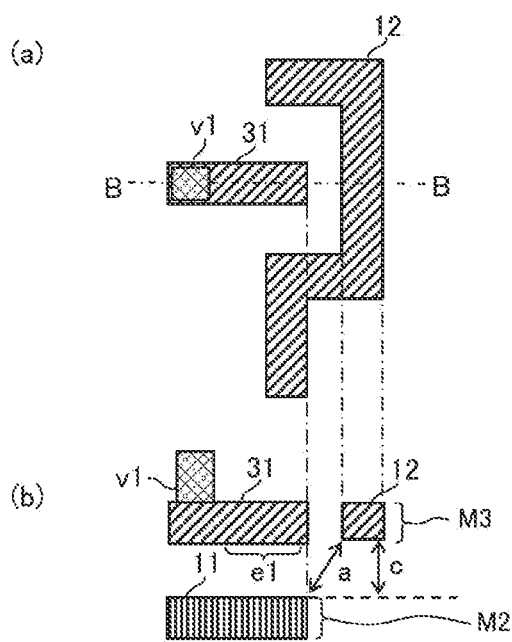
FIG. 22B illustrates a variation of the second example of the line layout in line layers.

FIG. 22B illustrates a variation of the second example of the line layout in line layers. The example in FIG. 22B is different from that in FIG. 22A in that line 31 is provided. The following gives description focusing on differences. Line 31 is disposed next to line 11 or 12, and includes via contact v1 and extending portion e1. Via contact v1 connects a line in another line layer to line 31 in line layer M3. Extending portion e1 extends from via contact v1. In addition, an extension rule as follows may be set. Specifically, the length from via v1 to an end of extending portion e1 is longer than the smallest dimension of a line specified by the design rule of the semiconductor device. Note that this extension rule may be applied to extending portions in other drawings.

In FIG. 22B, extending portion e1 of line 31 is disposed next to one line of the redundant line pair in the same line layer and next to the other line in the pair in a different line layer. Distance a is longer than the distance between line 11 and line 31 and is longer than the distance between line 12 and line 31.

Depending on a computer aided design (CAD) for line design, if the layout that does not include line 31 as shown in FIG. 22A is to be achieved, the CAD may require a limitation to use only a minimum number of lines between a redundant pair, and thus the layout may be difficult to be achieved. Disposition of a redundant line pair can be readily designed if line 31 is disposed next to line 11 or 12, as appropriate. As a result, a layout of a redundant line pair as shown in FIG. 22B can be readily achieved.

7.4 Another Example of Circuit of Semiconductor Device

Next, another example of a circuit that includes a redundant line pair is to be described.

Figure 23:
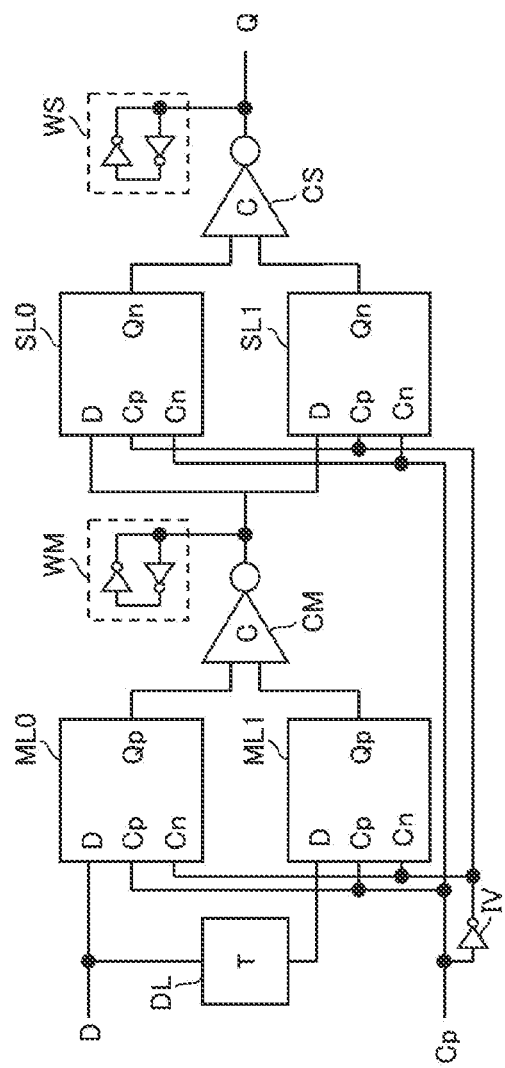
FIG. 23 illustrates another example of a circuit formed in the semiconductor device according to Embodiment 1.

FIG. 23 illustrates another example of a circuit formed in the semiconductor device according to Embodiment 1. In the semiconductor device in FIG. 23, an example of a configuration of a built-in soft error resilience (BISER) flip-flop circuit is shown as a circuit provided with soft error resistance.

The flip-flop circuit in FIG. 23 includes delay circuit DL, inverter IV, master latches ML0 and ML1, master C-element CM, slave latches SL0 and SL1, slave C-element CS, master weak keeper circuit WM, and slave weak keeper circuit WS, which form a dual master-slave structure. The redundant line pair in FIG. 23 include a line connected to output Qn of slave latch SL0, and a line connected to output Qn of slave latch SL1.

Delay circuit DL delays input data D that is input to master latch ML0 by time T, and outputs resultant data to master latch ML1.

Inverter IV outputs clock signal Cn resulting from inverting clock signal Cp.

Master latch ML0 latches input data D in synchronization with clock signal Cp and clock signal Cn, and outputs data Qp. Output data Qp is non-inverted output data having the same logic level as that of data D.

Master latch ML1 latches delayed input data D in synchronization with clock signal Cp and clock signal Cn, and outputs data Qp. Output data Qp is non-inverted output data having the same logic level as that of data D.

Master C-element CM is a two-input one-output inverting circuit. If two inputs have the determined same logic level, master C-element CM outputs a signal having a level that is the inverted determined logic level, and if the two inputs do not have the determined same logic level, the output thereof is placed in the high impedance state.

Master weak keeper circuit WM is a weak keeper circuit, holds a logic level of a signal output by master C-element CM, and if the output of master C-element CM is in the high impedance state, outputs a signal having a logic level held Immediately before the output is placed in the high impedance state.

Slave latch SL0 latches input data D in synchronization with clock signal Cp and clock signal Cn, and outputs data Qn. Output data Qn is data having a logic level that is an inverted logic level of data D.

Slave latch SL1 latches input data D in synchronization with clock signal Cp and clock signal Cn, and outputs data Qn. Output data Qn is data having a logic level that is an inverted logic level of data D.

Figure 24:
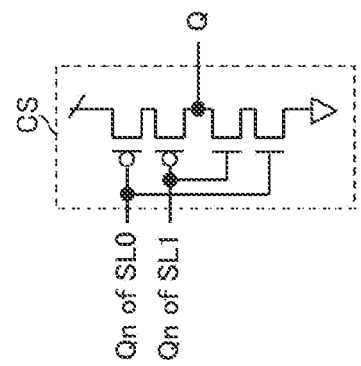
FIG. 24 illustrates an example of a circuit of a C-element in FIG. 23.

Slave C-element CS is a two-input one-output inverting circuit. If two inputs have the determined same logic level, slave C-element CS outputs a signal having a logic level that is the inverted determined logic level, and if the two inputs do not have the determined same logic level, the output thereof is placed in the high impedance state. FIG. 24 illustrates an example of a circuit of slave C-element CS. Slave C-element CS in FIG. 24 includes two PMOS transistors and two NMOS transistors. The two PMOS transistors and the two NMOS transistors are connected in series. Note that master C-element CM may include a circuit the same as the circuit illustrated in FIG. 24.

Slave weak keeper circuit WS is a weak keeper circuit, holds a logic level the same as that of a signal output by slave C-element CS, and if the output of slave C-element CS is in the high impedance state, outputs a signal having a logic level held immediately before the output is placed in the high impedance state.

In such a flip-flop circuit, if the output of one of the two sets of the master-slave latches is inverted by a soft error, the output of master C-element CM or slave C-element CS is placed in the high impedance state, but nevertheless correct data can be maintained owing to a logic level held by master weak keeper circuit WM or slave weak keeper circuit WS.

The redundant line pair in the flip-flop circuit in FIG. 23 include a line that connects the output terminal of slave latch SL0 to one of the two input terminals of slave C-element CS, and a line that connects the output terminal of slave latch SL1 to the other of the two input terminals of slave C-element CS. Stated differently, the output line of slave latch SL0 and the output line of slave latch SL1 form a redundant line pair.

The line pair satisfy the relation of the disposition layout described with reference to FIG. 13 to FIG. 22B. Accordingly, deterioration in soft error resistance caused by a short circuit of the redundant line pair in the flip-flop circuit in FIG. 23 can be reduced.

Note that the output line of master latch ML0 and the output line of master latch ML1 in FIG. 23 may be treated the same as a redundant line pair. Thus, the output lines may satisfy the relation of the disposition layout described with reference to FIG. 13 to FIG. 22B.

Input data D of master latch ML1 is delayed by time τ relative to input data D of master latch ML0. Accordingly, output data Qp of master latch ML1 is delayed by time τ relative to output data Qp of master latch ML0. In this Specification, a "redundant line pair" is defined as "independent lines that have the same signal level, but are not connected to each other". The output line of master latch ML0 and the output line of master latch ML1 do not satisfy this definition. Yet, the output line of master latch ML0 and the output line of master latch ML1 may have problems of the short circuits of lines as illustrated in FIG. 25, and substantially fall within the definition of "redundant line pair" except for delay time T. According to this, the output line of master latch ML0 and the output line of master latch ML1 can reduce deterioration in soft error resistance by satisfying the relation of the disposition layout described with reference to FIG. 13 to FIG. 22B.

Note that in the embodiment, as a redundant line pair, an example in which dual redundant pairs are included, yet two line combinations out of triple or more redundant line pairs may each be regarded as a redundant line pair. In this case, two lines considered to form a redundant line pair may satisfy the relation of the disposition layout described with reference to FIG. 13 to FIG. 22B.

As described above, a semiconductor device according to an embodiment includes: first line 11; second line 12 that is not connected to first line 11 and is provided to transfer a signal having a level same as a level of a signal transferred through first line 11; and another line 21/22 different from first line 11 and second line 12. In a line layer, distance a between first line 11 and second line 12 is longer than distance b1/b3 between first line 11 and another line 21/22, and is longer than distance b2/b4 between second line 12 and another line 21/22.

According to this, deterioration in soft error resistance caused by a short circuit of a redundant line pair can be reduced. That is because if a foreign substance having approximately the same size as a distance between lines is mixed into, a short circuit between one of the other lines and the first line or the second line is more likely to occur than a short circuit between the first line and the second line. As a result, an undetectable short circuit can be prevented from occurring, or stated differently, a redundant line pair can be prevented from short-circuiting.

Here, the line layer may include a parallel section in which first line 11 and second line 12 are disposed parallel to each other, and other lines 21 and 22 may be located between first line 11 and second line 12 in the parallel section.

Here, in the line layer, another line 21/22 may include extending portion e1 that extends from a body portion thereof, and extending portion e1 may be located between first line 11 and second line 12 in the parallel section in the line layer.

Here, another line 21/22 may include extending portion e1 that extends from a via connected to a body portion thereof, and extending portion e1 may be located between first line 11 and second line 12 in the parallel section in the line layer.

Here, in the line layer, another line 21/22 may include extending portion e1 that branches and extends from a body portion thereof, and extending portion e1 may be located between first line 11 and second line 12 in the parallel section in the line layer.

Here, an end of extending portion e1 may be an open end that is not connected in the line layer.

Here, extending portions e1 to e3 may each bypass an end portion of one of first line 11 and second line 12 in the line layer, and may each be disposed throughout the parallel section.

Here, the semiconductor device may further include: a third line; and a fourth line that is not connected to first line 11 and is provided to transfer a signal having a level same as a level of a signal transferred through the third line, another line 21 or 22 may be the third line.

Here, a portion of first line 11, a portion of the third line, a portion of second line 12, and a portion of the fourth line may be disposed in stated order in the line layer.

According to this, one line of a first redundant pair, one line of a second redundant pair, the other line of the first redundant pair, and the other line of the second redundant pair are disposed in this order, and thus short circuits of the redundant pairs can be prevented or can be made less likely to occur.

Here, the via may connect the extending portion to the body portion of another line 21/22, the body portion being included in another line layer different from the line layer.

Here, a length of extending portion e1 may be greater than a smallest dimension specified by a design rule of the semiconductor device.

Here, the line layer may include a section in which first line 11 and second line 12 are disposed parallel to each other with another line 21/22 and different another line 21/22 being located therebetween, different another line 21/22 being different from first line 11, second line 12, and another line 21/22, and in the section, distance dl between another line 21/22 and different another line 21/22 may be shorter than a distance between first line 11 and second line 12.

Here, first line 11 and second line 12 may be included in a dual interlocked storage cell (DICE) latch circuit.

Here, first line 11 and second line 12 may be included in a built-in soft error resiliency (BISER) flip-flop circuit.

A semiconductor device according to an embodiment includes: a plurality of line layers; first line 11; and second line 12 that is not connected to first line 11 and is disposed to transfer a signal having a level same as a level of a signal transferred through first line 11. First line 11 and second line 12 are included in different line layers, and distance a1 between first line 11 and second line 12 is longer than interlayer distance c between line layers next to each other.

According to this, deterioration in soft error resistance caused by a short circuit of a redundant line pair can be reduced. That is because if a foreign substance having substantially the same size as the distance between lines is mixed into, the first line and the second line are less likely to short-circuit. Stated differently, a short circuit of a redundant line pair can be prevented from occurring.

Here, in a plan view of the semiconductor device, the semiconductor device may have an overlapping portion in which first line 11 and second line 12 overlap each other, and a distance between first line 11 and second line 12 in the overlapping portion may be at least twice interlayer distance c.

Here, in the plan view of the semiconductor device, first line 11 and second line 12 may cross each other in the overlapping portion, second line 12 may include first partial line 12b in which the overlapping portion is included, second partial line 12a connected to a first end of first partial line 12b, and third partial line 12c connected to a second end of first partial line 12b, first partial line 12b may be included in first line layer M1, second partial line 12a and third partial line 12c may be included in second line layer M2 different from first line layer M1, and may be connected to first partial line 12b through via contacts v1 and v2, respectively, and first line 11 may be included in third line layer M3 farther from first line layer M1 than from second line layer M2.

Here, in a plan view of the semiconductor device, second line 12 may bypass an end portion of first line 11 to prevent first line 11 and second line 12 from overlapping.

Here, the semiconductor device may further include third line 31 opposed to at least one of first line 11 or second line 12, third line 31 and the at least one of first line 11 or second line 12 being included in one of or different ones of the plurality of line layers. Third line 31 may include extending portion e1 that extends from one of the vias.

Here, a length of extending portion e1 may be greater than a smallest dimension specified by a design rule of the semiconductor device.

The above has described a plurality of embodiments, yet elements in the embodiments may be combined to form a new embodiment. If a circuit other than an inverter or two-input NAND circuit has a function of causing input and output to have an inverted relation, such a circuit may be regarded as an inverter without limiting the circuit configuration to a specific one.

The above has described a semiconductor device according to one or more aspects of the present disclosure, based on embodiments, yet the present disclosure is not limited to such embodiments. The scope of the one or more aspects of the present disclosure may encompass embodiments as a result of making, to the embodiments, various modifications that may be conceived by those skilled in the art and combining elements in different embodiments, as long as the resultant embodiments do not depart from the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

As described above, the semiconductor device according to the present disclosure having a small area and high soft error resistance can be provided, and thus is useful as a semiconductor integrated circuit included in an electronic device that requires to have a small area and operate stably, such as an on-vehicle device, for instance.

The invention claimed is:

1. A semiconductor device comprising:
a first latch circuit that includes a first inverting circuit, a second inverting circuit, a third inverting circuit, and a fourth inverting circuit;
a first first-type well region;
a second first-type well region; and
a second-type well region,
wherein the first inverting circuit, the second inverting circuit, the third inverting circuit, and the fourth inverting circuit each include:
a first-type MOS transistor;
a second-type MOS transistor; and
an output node connected to a drain of the first-type MOS transistor and a drain of the second-type MOS transistor,
the output node of the first inverting circuit is connected to a gate of the first-type MOS transistor in the second inverting circuit and a gate of the second-type MOS transistor in the fourth inverting circuit,
the output node of the second inverting circuit is connected to a gate of the first-type MOS transistor in the third inverting circuit and a gate of the second-type MOS transistor in the first inverting circuit,
the output node of the third inverting circuit is connected to a gate of the first-type MOS transistor in the fourth inverting circuit and a gate of the second-type MOS transistor in the second inverting circuit,
the output node of the fourth inverting circuit is connected to a gate of the first-type MOS transistor in the first inverting circuit and a gate of the second-type MOS transistor in the third inverting circuit,
the drain of the first-type MOS transistor in the first inverting circuit, the drain of the first-type MOS transistor in the second inverting circuit, the drain of the first-type MOS transistor in the third inverting circuit, and the drain of the first-type MOS transistor in the fourth inverting circuit are disposed in the second-type well region, the drain of the second-type MOS transistor in the first inverting circuit and the drain of the second-type MOS transistor in the second inverting circuit are disposed in the first first-type well region, the drain of the second-type MOS transistor in the third inverting circuit and the drain of the second-type MOS transistor in the fourth inverting circuit are disposed in the second first-type well region, the second-type well region is located between the first first-type well region and the second first-type well region, in a plan view, a distance between the drain of the first-type MOS transistor in the first inverting circuit and the drain of the first-type MOS transistor in the third inverting circuit is longer than a distance between the drain of the first-type MOS transistor in the first inverting circuit and the drain of the first-type MOS transistor in the fourth inverting circuit, the semiconductor device further includes:
a second latch circuit that includes a fifth inverting circuit, a sixth inverting circuit, a seventh inverting circuit, and an eighth inverting circuit, the second latch circuit being located downstream of the first latch circuit, the fifth inverting circuit, the sixth inverting circuit, the seventh inverting circuit, and the eighth inverting circuit each include:
a first-type MOS transistor;
a second-type MOS transistor; and
an output node connected to a drain of the first-type MOS transistor and a drain of the second-type MOS transistor, the output node of the fifth inverting circuit is connected to a gate of the first-type MOS transistor in the sixth inverting circuit and a gate of the second-type MOS transistor in the eighth inverting circuit, the output node of the sixth inverting circuit is connected to a gate of the first-type MOS transistor in the seventh inverting circuit and a gate of the second-type MOS transistor in the fifth inverting circuit, the output node of the seventh inverting circuit is connected to a gate of the first-type MOS transistor in the eighth inverting circuit and a gate of the second-type MOS transistor in the sixth inverting circuit, the output node of the eighth inverting circuit is connected to a gate of the first-type MOS transistor in the fifth inverting circuit and a gate of the second-type MOS transistor in the seventh inverting circuit, the drain of the first-type MOS transistor in the fifth inverting circuit, the drain of the first-type MOS transistor in the sixth inverting circuit, the drain of the first-type MOS transistor in the seventh inverting circuit, and the drain of the first-type MOS transistor in the eighth inverting circuit are disposed in the second-type well region, the drain of the second-type MOS transistor in the fifth inverting circuit and the drain of the second-type MOS transistor in the sixth inverting circuit are disposed in the first first-type well region, the drain of the second-type MOS transistor in the seventh inverting circuit and the drain of the second-type MOS transistor in the eighth inverting circuit are disposed in the second first-type well region, in the plan view, a distance between the drain of the first-type MOS transistor in the fifth inverting circuit and the drain of the first-type MOS transistor in the seventh inverting circuit is longer than a distance between the drain of the first-type MOS transistor in the fifth inverting circuit and the drain of the first-type MOS transistor in the eighth inverting circuit, and in the plan view, out of the drain of the first-type MOS transistor in the first inverting circuit, the drain of the first-type MOS transistor in the second inverting circuit, the drain of the first-type MOS transistor in the third inverting circuit, the drain of the first-type MOS transistor in the fourth inverting circuit, the drain of the first-type MOS transistor in the fifth inverting circuit, the drain of the first-type MOS transistor in the sixth inverting circuit, the drain of the first-type MOS transistor in the seventh inverting circuit, and the drain of the first-type MOS transistor in the eighth inverting circuit, the drain of the first-type MOS transistor in the seventh inverting circuit is closest to the drain of the first-type MOS transistor in the first inverting circuit, and the drain of the first-type MOS transistor in the eighth inverting circuit is closest to the drain of the first-type MOS transistor in the second inverting circuit.

2. The semiconductor device according to claim 1, wherein the first first-type well region and the second first-type well region are each a P-type well, and the second-type well region is an N-type well.

3. The semiconductor device according to claim 1, wherein in the plan view, a distance between the drain of the first-type MOS transistor in the second inverting circuit and the drain of the first-type MOS transistor in the fourth inverting circuit is longer than a distance between the drain of the first-type MOS transistor in the second inverting circuit and the drain of the first-type MOS transistor in the third inverting circuit, and is longer than a distance between the drain of the first-type MOS transistor in the third inverting circuit and the drain of the first-type MOS transistor in the fourth inverting circuit.

4. The semiconductor device according to claim 1, wherein in the plan view, out of the drain of the first-type MOS transistor in the first inverting circuit, the drain of the first-type MOS transistor in the second inverting circuit, the drain of the first-type MOS transistor in the third inverting circuit, the drain of the first-type MOS transistor in the fourth inverting circuit, the drain of the first-type MOS transistor in the fifth inverting circuit, the drain of the first-type MOS transistor in the sixth inverting circuit, the drain of the first-type MOS transistor in the seventh inverting circuit, and the drain of the first-type MOS transistor in the eighth inverting circuit, the drain of the first-type MOS transistor in the fifth inverting circuit is closest to the drain of the first-type MOS transistor in the third inverting circuit, and the drain of the first-type MOS transistor in the sixth inverting circuit is closest to the drain of the first-type MOS transistor in the fourth inverting circuit.

5. The semiconductor device according to claim 1, wherein at least one of the first inverting circuit, the second inverting circuit, the third inverting circuit, the fourth inverting circuit, the fifth inverting circuit, the sixth inverting circuit, the seventh inverting circuit, or the eighth inverting circuit is a clocked inverting circuit that receives a clock signal.

6. A semiconductor device comprising:
a first latch circuit that includes a first inverting circuit, a second inverting circuit, a third inverting circuit, and a fourth inverting circuit;
a first first-type well region;
a second first-type well region; and
a second-type well region,
wherein the first inverting circuit, the second inverting circuit, the third inverting circuit, and the fourth inverting circuit each include:
   a first-type MOS transistor;
   a second-type MOS transistor; and
   an output node connected to a drain of the first-type MOS transistor and a drain of the second-type MOS transistor,
the output node of the first inverting circuit is connected to a gate of the first-type MOS transistor in the second inverting circuit and a gate of the second-type MOS transistor in the fourth inverting circuit,
the output node of the second inverting circuit is connected to a gate of the first-type MOS transistor in the third inverting circuit and a gate of the second-type MOS transistor in the first inverting circuit,
the output node of the third inverting circuit is connected to a gate of the first-type MOS transistor in the fourth inverting circuit and a gate of the second-type MOS transistor in the second inverting circuit,
the output node of the fourth inverting circuit is connected to a gate of the first-type MOS transistor in the first inverting circuit and a gate of the second-type MOS transistor in the third inverting circuit,
the drain of the first-type MOS transistor in the first inverting circuit, the drain of the first-type MOS transistor in the second inverting circuit, the drain of the first-type MOS transistor in the third inverting circuit, and the drain of the first-type MOS transistor in the fourth inverting circuit are disposed in the second-type well region,
the drain of the second-type MOS transistor in the first inverting circuit and the drain of the second-type MOS transistor in the second inverting circuit are disposed in the first first-type well region,
the drain of the second-type MOS transistor in the third inverting circuit and the drain of the second-type MOS transistor in the fourth inverting circuit are disposed in the second first-type well region,
the second-type well region is located between the first first-type well region and the second first-type well region,
in a plan view, a distance between the drain of the first-type MOS transistor in the first inverting circuit and the drain of the first-type MOS transistor in the third inverting circuit is longer than a distance between the drain of the first-type MOS transistor in the first inverting circuit and the drain of the first-type MOS transistor in the fourth inverting circuit,
the semiconductor device further includes:
   a second latch circuit that includes a fifth inverting circuit, a sixth inverting circuit, a seventh inverting circuit, and an eighth inverting circuit, the second latch circuit being located downstream of the first latch circuit,
the fifth inverting circuit, the sixth inverting circuit, the seventh inverting circuit, and the eighth inverting circuit each include:
   a first-type MOS transistor;
   a second-type MOS transistor; and
   an output node connected to a drain of the first-type MOS transistor and a drain of the second-type MOS transistor,
the output node of the fifth inverting circuit is connected to a gate of the first-type MOS transistor in the sixth inverting circuit and a gate of the second-type MOS transistor in the eighth inverting circuit,
the output node of the sixth inverting circuit is connected to a gate of the first-type MOS transistor in the seventh inverting circuit and a gate of the second-type MOS transistor in the fifth inverting circuit,
the output node of the seventh inverting circuit is connected to a gate of the first-type MOS transistor in the eighth inverting circuit and a gate of the second-type MOS transistor in the sixth inverting circuit,
the output node of the eighth inverting circuit is connected to a gate of the first-type MOS transistor in the fifth inverting circuit and a gate of the second-type MOS transistor in the seventh inverting circuit,
the drain of the first-type MOS transistor in the fifth inverting circuit, the drain of the first-type MOS transistor in the sixth inverting circuit, the drain of the first-type MOS transistor in the seventh inverting circuit, and the drain of the first-type MOS transistor in the eighth inverting circuit are disposed in the second-type well region,
the drain of the second-type MOS transistor in the fifth inverting circuit and the drain of the second-type MOS transistor in the sixth inverting circuit are disposed in the first first-type well region,
the drain of the second-type MOS transistor in the seventh inverting circuit and the drain of the second-type MOS transistor in the eighth inverting circuit are disposed in the second first-type well region,
in the plan view, a distance between the drain of the first-type MOS transistor in the fifth inverting circuit and the drain of the first-type MOS transistor in the seventh inverting circuit is longer than a distance between the drain of the first-type MOS transistor in the fifth inverting circuit and the drain of the first-type MOS transistor in the eighth inverting circuit, and
at least one of the first inverting circuit, the second inverting circuit, the third inverting circuit, the fourth inverting circuit, the fifth inverting circuit, the sixth inverting circuit, the seventh inverting circuit, or the eighth inverting circuit is a NAND-type inverting circuit that receives a reset signal or a set signal.

7. A semiconductor device comprising:
a first latch circuit that includes a first inverting circuit, a second inverting circuit, a third inverting circuit, and a fourth inverting circuit;
a first first-type well region;
a second first-type well region; and
a second-type well region,
wherein the first inverting circuit, the second inverting circuit, the third inverting circuit, and the fourth inverting circuit each include:
   a first-type MOS transistor;
   a second-type MOS transistor; and
   an output node connected to a drain of the first-type MOS transistor and a drain of the second-type MOS transistor,
the output node of the first inverting circuit is connected to a gate of the first-type MOS transistor in the second inverting circuit and a gate of the second-type MOS transistor in the fourth inverting circuit, the output node of the second inverting circuit is connected to a gate of the first-type MOS transistor in the third inverting circuit and a gate of the second-type MOS transistor in the first inverting circuit, the output node of the third inverting circuit is connected to a gate of the first-type MOS transistor in the fourth inverting circuit and a gate of the second-type MOS transistor in the second inverting circuit, the output node of the fourth inverting circuit is connected to a gate of the first-type MOS transistor in the first inverting circuit and a gate of the second-type MOS transistor in the third inverting circuit, the drain of the first-type MOS transistor in the first inverting circuit, the drain of the first-type MOS transistor in the second inverting circuit, the drain of the first-type MOS transistor in the third inverting circuit, and the drain of the first-type MOS transistor in the fourth inverting circuit are disposed in the second-type well region, the drain of the second-type MOS transistor in the first inverting circuit and the drain of the second-type MOS transistor in the second inverting circuit are disposed in the first first-type well region, the drain of the second-type MOS transistor in the third inverting circuit and the drain of the second-type MOS transistor in the fourth inverting circuit are disposed in the second first-type well region, the second-type well region is located between the first first-type well region and the second first-type well region, in a plan view, a distance between the drain of the first-type MOS transistor in the first inverting circuit and the drain of the first-type MOS transistor in the third inverting circuit is longer than a distance between the drain of the first-type MOS transistor in the first inverting circuit and the drain of the first-type MOS transistor in the fourth inverting circuit, the semiconductor device further includes:
 a second latch circuit that includes a fifth inverting circuit, a sixth inverting circuit, a seventh inverting circuit, and an eighth inverting circuit, the second latch circuit being located downstream of the first latch circuit, the fifth inverting circuit, the sixth inverting circuit, the seventh inverting circuit, and the eighth inverting circuit each include:
 a first-type MOS transistor;
 a second-type MOS transistor; and
 an output node connected to a drain of the first-type MOS transistor and a drain of the second-type MOS transistor, the output node of the fifth inverting circuit is connected to a gate of the first-type MOS transistor in the sixth inverting circuit and a gate of the second-type MOS transistor in the eighth inverting circuit, the output node of the sixth inverting circuit is connected to a gate of the first-type MOS transistor in the seventh inverting circuit and a gate of the second-type MOS transistor in the fifth inverting circuit, the output node of the seventh inverting circuit is connected to a gate of the first-type MOS transistor in the eighth inverting circuit and a gate of the second-type MOS transistor in the sixth inverting circuit, the output node of the eighth inverting circuit is connected to a gate of the first-type MOS transistor in the fifth inverting circuit and a gate of the second-type MOS transistor in the seventh inverting circuit, the drain of the first-type MOS transistor in the fifth inverting circuit, the drain of the first-type MOS transistor in the sixth inverting circuit, the drain of the first-type MOS transistor in the seventh inverting circuit, and the drain of the first-type MOS transistor in the eighth inverting circuit are disposed in the second-type well region, the drain of the second-type MOS transistor in the fifth inverting circuit and the drain of the second-type MOS transistor in the sixth inverting circuit are disposed in the first first-type well region, the drain of the second-type MOS transistor in the seventh inverting circuit and the drain of the second-type MOS transistor in the eighth inverting circuit are disposed in the second first-type well region, in the plan view, a distance between the drain of the first-type MOS transistor in the fifth inverting circuit and the drain of the first-type MOS transistor in the seventh inverting circuit is longer than a distance between the drain of the first-type MOS transistor in the fifth inverting circuit and the drain of the first-type MOS transistor in the eighth inverting circuit, the semiconductor device further includes:
 a data input circuit; and
 a clock input circuit, the data input circuit is an inverter circuit that includes at least one first-type MOS transistor, the clock input circuit includes inverter circuits in two stages, the inverter circuits in the two stages include at least one first-type MOS transistor, one of a drain of the at least one first-type MOS transistor in the data input circuit and a drain of the at least one first-type MOS transistor in the clock input circuit is aligned in a first direction with the drain of the first-type MOS transistor in the first inverting circuit and the drain of the first-type MOS transistor in the second inverting circuit, and a remaining one of the drain of the at least one first-type MOS transistor in the data input circuit and the drain of the at least one first-type MOS transistor in the clock input circuit is aligned in the first direction with the drain of the first-type MOS transistor in the third inverting circuit and the drain of the first-type MOS transistor in the fourth inverting circuit.

* * * * *